US 6,663,712 B2

United States Patent
Doyle et al.

(10) Patent No.: US 6,663,712 B2
(45) Date of Patent: Dec. 16, 2003

(54) DUAL TRACK STENCILING SYSTEM WITH SOLDER GATHERING HEAD

(75) Inventors: Dennis G. Doyle, Shrewsbury, MA (US); Steven W. Hall, Douglas, MA (US); Gary T. Freeman, Beverly, MA (US)

(73) Assignee: Speedline Technologies, Inc., Franklin, MA (US)

( * ) Notice: Subject to any disclaimer, the term of this patent is extended or adjusted under 35 U.S.C. 154(b) by 0 days.

(21) Appl. No.: 09/918,698

(22) Filed: Jul. 31, 2001

(65) Prior Publication Data

US 2002/0020346 A1 Feb. 21, 2002

Related U.S. Application Data

(63) Continuation of application No. 09/498,239, filed on Feb. 3, 2000, now Pat. No. 6,267,819, which is a continuation of application No. 08/920,121, filed on Aug. 26, 1997, now Pat. No. 6,066,206, and a continuation-in-part of application No. 08/802,934, filed on Feb. 22, 1997, now Pat. No. 5,873,939.

(51) Int. Cl.$^7$ .............................. B05C 5/00; B05C 1/16; B41F 17/00; B05D 5/12; B65G 15/10
(52) U.S. Cl. ..................... 118/301; 118/213; 118/313; 101/44; 101/114; 101/127.1; 427/96; 427/282; 198/817
(58) Field of Search ..................... 101/114, 44, 121, 101/123, 127, 127.1, 366; 118/213, 301, 406, 410, 413, 313; 427/96, 282; 198/817

(56) References Cited

U.S. PATENT DOCUMENTS

| | | | |
|---|---|---|---|
| 4,268,545 A | 5/1981 | Hodulik | 118/213 |
| 4,622,239 A | 7/1986 | Schoenthaler et al. | 427/96 |
| 4,649,635 A | 7/1987 | Asai et al. | 29/759 |
| 4,715,278 A | 12/1987 | Ericsson | 101/123 |

(List continued on next page.)

FOREIGN PATENT DOCUMENTS

| | | |
|---|---|---|
| EP | 0 278 457 A2 | 8/1988 |
| JP | 01114098 | 5/1989 |
| JP | 01232047 | 9/1989 |
| JP | 04317392 | 11/1992 |
| JP | 08002085 | 1/1996 |
| WO | WO 86/03367 | 6/1986 |
| WO | WO 95/19099 | 7/1995 |
| WO | WO 96/20088 | 7/1996 |

OTHER PUBLICATIONS

*Gore, K.P. et al., "Two Independent X–Y Tables Concept for Simultaneous Screen Printing", Motorola Technical Developments, vol. 13, pp. 38–39, Jul. 1991, Schaumburg, IL, United States.

"Component Placement", Solutions for Today, pp. 22–25, a supplement of SMT Magazine, Jul. 1997.

Extract of SMT Magazine, May 1995, pp. 2.

Extract of SMT Magazine, Apr. 1994, pp. 2.

(List continued on next page.)

*Primary Examiner*—J. A. Lorengo
(74) *Attorney, Agent, or Firm*—Mintz, Levin, Cohn, Ferris, Glovsky and Popeo, P.C.

(57) ABSTRACT

A dual track stencil system includes a first set of rails and a second set of rails, each of the rails being independently controlled for allowing for independent movement of circuit boards through the stencil system for processing. A stencil, having two patterns, each aligned with a respective working area of each track is suspended above the dual track system. In one embodiment, the solder dispensing unit includes a squeegee arm with a solder gathering head. During operation using the squeegee arm with the solder gathering head, two circuit boards are fed to the working area, and both of the circuit boards are serially processed, with excess solder being removed from the board after the processing of each of the boards.

14 Claims, 20 Drawing Sheets

U.S. PATENT DOCUMENTS

| | | | |
|---|---|---|---|
| 4,726,168 A | | 2/1988 | Seko .......................... 53/450 |
| 4,807,794 A | | 2/1989 | Hess .......................... 228/102 |
| 4,890,241 A | * | 12/1989 | Hoffman et al. ............ 364/513 |
| 4,946,021 A | | 8/1990 | Murphy ...................... 198/375 |
| 5,009,306 A | | 4/1991 | Roderick et al. ........... 198/414 |
| 5,029,697 A | | 7/1991 | McMillan et al. ........ 198/860.2 |
| 5,032,426 A | | 7/1991 | Sumner, Jr. .................. 427/96 |
| 5,044,306 A | * | 9/1991 | Erdmann ..................... 118/120 |
| 5,060,063 A | | 10/1991 | Freeman ..................... 358/101 |
| 5,151,132 A | | 9/1992 | Zimmer ...................... 118/126 |
| 5,240,104 A | | 8/1993 | Douglas ..................... 198/817 |
| RE34,615 E | | 5/1994 | Freeman ...................... 348/95 |
| 5,309,837 A | | 5/1994 | Nanzai ....................... 101/425 |
| 5,436,028 A | | 7/1995 | Becher et al. ............... 427/96 |
| 5,483,884 A | * | 1/1996 | Vellanki ..................... 101/129 |
| 5,737,834 A | * | 4/1998 | Sabotke et al. ............... 29/840 |
| 5,823,316 A | * | 10/1998 | Shaw et al. ................. 198/341 |
| 5,873,939 A | * | 2/1999 | Doyle et al. ................ 118/213 |
| 5,925,187 A | | 7/1999 | Freeman et al. ............ 118/667 |

OTHER PUBLICATIONS

"The Case for Gantry Robots in Machine Loading", Robotics Today (Aug. 1984), vol. 6, No. 4, pp. 23–26.

Siplace News, Aug. 1, 1995, pp. 2–12.

Siplace News, Feb. 2, 1996, pp. 2–12.

Electronic Packaging & Production, Jan. 1997, pp. 2.

"A new concept in high–volume SMT", Electronic Production, vol. 23, No. 3, Mar. 1994, pp. 33, 35 and 37.

Electronic Production, vol. 25, No. 5, May 1996, pp. 2.

SIEMENS, SIPLACE 80 S–20:The Placement System with Two Revolver Heads for High–End Speed, pp. 6.

SIEMENS, SIPLACE 80 S–15: The High–Speed SMD Placement System with 2 Revolver Heads, pp. 12.

SIEMENS, SIPLACE G: For the Rapid and reproducible Application of Adhesive, pp. 4.

"Fast Component Mounter", Philips Surface Mount Assembly Equipment: On top of your needs, pp. 6–9.

"FCM dual–lane transport handles both sides of a PCB in one pass", Philips Electronic Manufacturing Technology, pp. 2.

International Search Report dated Jun. 19, 1998.

* cited by examiner

US 6,663,712 B2

DUAL TRACK STENCILING SYSTEM WITH SOLDER GATHERING HEAD

RELATED APPLICATIONS

This application is a continuation of Ser. No. 09/498,239, filed Feb. 3, 2000, now U.S. Pat. No. 6,267,819, which is a continuation of Ser. No. 08/920,121 filed Aug. 26, 1997, now U.S. Pat. No. 6,066,206 which is a CIP of Ser. No. 08/802,934, filed Feb. 22, 1997, now U.S. Pat. No. 5,873,939.

FIELD OF THE INVENTION

This invention relates generally to the field of circuit board manufacturing and more specifically to a method and apparatus for improving the performance of circuit board stenciling operations.

BACKGROUND OF THE INVENTION

As it is known in the art, the success of circuit board manufacturers is measured in terms of the number of defect-free products they are able to supply in a given time period. Unfortunately, the achievement of desired productivity levels is hampered by the accuracy requirements inherent in providing such defect-free products. The accuracy requirements become even more difficult to attain as technological advances command smaller component sizes and more pins per package fitting on a circuit board with very closely spaced pads. Defective boards may be either rejected outright or reworked, both of which costs time and increases expense.

For example, the typical circuit board manufacturing process includes three basic operations, each of which is usually performed by an independent machine. These operations include stenciling of a pattern of solder onto the pads of an incoming circuit board, placement of components on the pads of the board, and heating the board to establish the integrity of the contact between the solder and the board, the pins of the components, and the pads.

The stenciling and the placement operations must be performed in a precise manner to ensure that a defect-free product is provided. The stenciling operation is typically performed by a stencil machine. Boards that are fed into the stencil machine have a pattern of pads or other, usually conductive surface areas onto which solder will be deposited. In addition, one or more small holes, or marks, called fiducials, are provided on the board for alignment purposes. The stencil machine also typically includes a stencil (or screen) having a pattern of apertures etched through the stencil that matches the expected solder pattern to be placed on the circuit board.

When the circuit board is fed into the stencil machine, it first must be aligned with the stencil to make sure that the circuit board is appropriately aligned with the apertures of the stencil. One apparatus for performing this task is an optical alignment system that is introduced between the circuit board and the stencil for aligning the fiducials of the board with one or more fiducials on the stencil. For example, optical alignment systems provided by MPM™ Corporation, such as those described in U.S. Pat. No. 5,060,063, issued Oct. 21, 1991, by Freeman and in U.S. Pat. No. RE 34,615 issued Jan. 31, 1992 by Freeman, each of which is incorporated herein by reference, may alternatively be used.

When the board has been aligned with the stencil, it is raised to the stencil, solder is dispensed on the stencil, and a wiper blade (or squeegee) traverses the stencil to dispense the solder through the apertures of the stencil onto the board. After stenciling is complete, the board is lowered and forwarded to a pick and place machine that places electrical components at specific locations on the board.

The pick and place machine provides the components that are required by the board. Components are placed at the appropriate locations (the location of solder deposition performed by the stencil machine) and with the proper orientation on the circuit board. Because of the number of pins of a component and the proximity between the pins, it is essential that the pick and place machine operate to precise standards to ensure the correct placement of the component upon the soldered connections. Thus the pick and place machine must also perform alignment checks before operation.

The next step in the process is to forward the circuit board having the components laid upon the stenciled solder to a reflow machine. The reflow machine heats the existing solder to cause the solder to form tight connections with the pins of the components that were placed by the pick and place machine and the pads or other surfaces of the board.

In the systems described above, the accuracy required in the printing of solder on circuit boards and in the placement of components on the printed solder leads to the use of alignment procedures for the circuit board which cause delays in the manufacturing process. In addition, there is an added element of delay, referred to as 'dwell time' at the pick and place machine as the pick and place machine waits to receive a board from the stenciling machine. Each of these delays reduces the overall performance and productivity of the manufacturing process. It would be desirable to develop a method and apparatus for increasing the throughput of the circuit board manufacturing process.

SUMMARY OF THE INVENTION

According to one aspect of the invention, a stenciling system for use in a circuit board manufacturing process includes a plurality of sets of rails, each of said plurality of sets of rails for supporting and advancing a plurality of circuit boards through said stenciling system and a solder gathering squeegee arm, disposed over the plurality of sets of rails, for depositing solder on a screen during the stenciling of a first circuit board on a first one of the plurality of sets of rails, and for removing excess solder from the screen after the stenciling of the first circuit board. With such an arrangement, a flexible dual track stenciling system is provided that is not restricted to any particular processing sequence because solder is retained in the solder head rather than left on the screen.

According to another aspect of the invention, a method for processing circuit boards in a stenciling system having two tracks is provided. Each track has a loader for accepting circuit boards and advancing said boards to like positions within the tracks. The stenciling system includes a solder dispensing mechanism for dispensing solder on a stencil disposed over the tracks and for removing excess solder from the stencil. The method includes the steps of receiving a pair of boards, each one of the pair of boards on a different one of the tracks, engaging the pair of boards, the stencil and the solder dispensing mechanism, advancing the solder dispensing unit over the stencil over a first one of the pair of circuit boards on a first one of the tracks to dispose solder through the stencil onto the first one of the pair of circuit boards, removing, by the solder dispensing unit, excess solder from the stencil, advancing the solder dispensing unit to a second one of the tracks, and advancing the solder dispensing mechanism over the stencil over the second one of the pair of circuit boards on the second one of the tracks to dispose solder through the stencil onto the second one of the pair of circuit boards. With such an arrangement, by using a solder dispensing mechanism that is capable of both dispensing and removing excess solder, both circuit boards may be simultaneously engaged and serially stenciled in the dual track stenciling system, thereby increasing the overall performance and flexibility of the system.

According to another aspect of the invention, a stenciling system for use in a circuit board manufacturing process includes a plurality of sets of rails, each of the plurality of sets of rails for supporting and advancing a plurality of circuit boards through the stenciling system, and a solder dispensing head, disposed over the plurality of sets of rails, for depositing solder on a stencil during the stenciling of a first circuit board on a first one of the plurality of sets of rails.

According to another aspect of the invention, a method for processing circuit boards in a stenciling system having two tracks is provided. Each track has a loader for accepting circuit boards and advancing the boards to like positions within the tracks. The stenciling system includes a solder dispensing mechanism for dispensing solder on a stencil disposed one the tracks. The method includes the steps of receiving at least one boards on one of the tracks, engaging the at least one board, the stencil and the solder dispensing mechanism, passing the solder dispensing mechanism over the at least one board such that solder is extruded through an opening of the solder dispensing mechanism, through the stencil and onto the circuit board, the opening having an associated width and repeating the step of passing until the width of the opening has traversed over all of a pattern on the stencil associated with the at least one circuit board to stencil all of the at least one circuit board.

DETAILED DESCRIPTION OF THE INVENTION

Figure 1:
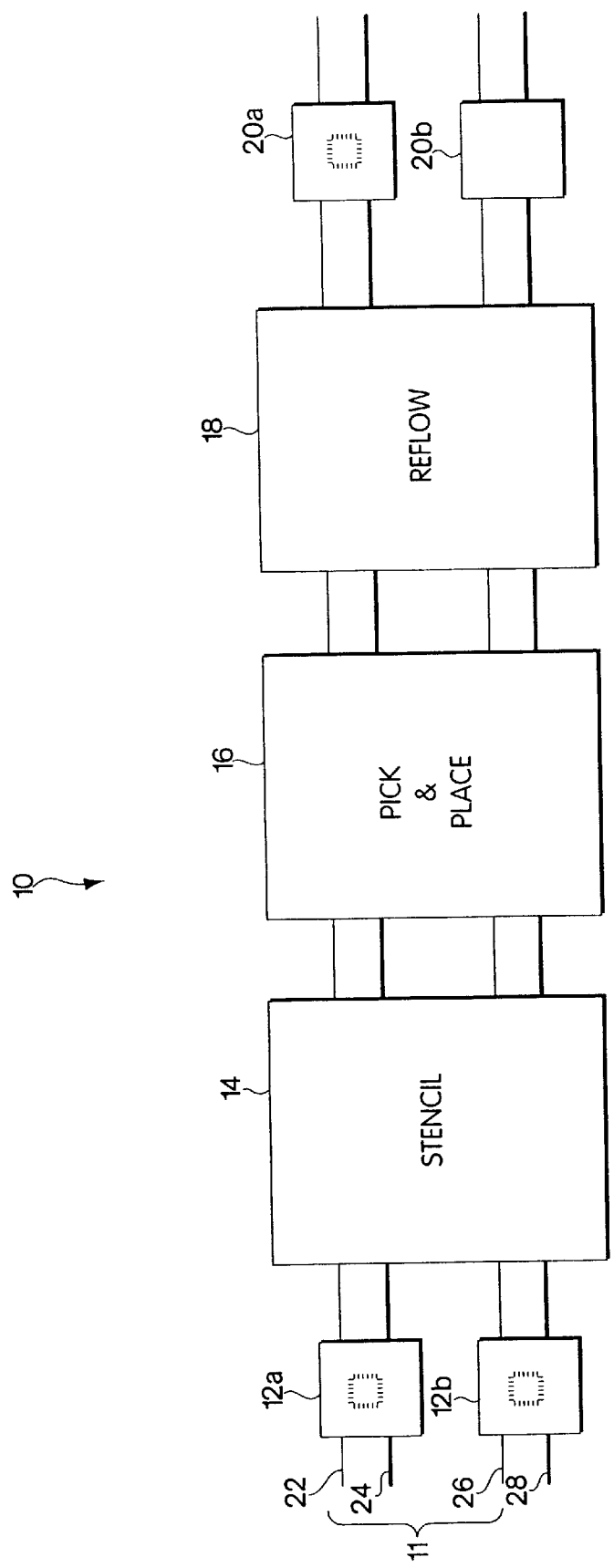
FIG. 1 is the flow diagram illustrating the discrete steps used in a circuit board manufacturing process according to the present invention.

Referring now to FIG. 1, an apparatus for providing improved performance for circuit board manufacturing includes a dual track rail system 11 for providing a pair of circuit boards 12a and 12b to the stenciling machine 14. The dual track nature of the system is incorporated at the pick and place machine, thus allowing for two boards to be independently forwarded to the pick and place machine 16. Each of the tracks extends to provide a dual input path to a reflow machine 18. Completed circuit boards 20a and 20b exit from the reflow machine 18. The interface between the stencil machine 14, the pick and place machine 16 and the reflow machine is controlled according to protocols set forth by the Surface Mount Equipment Manufacturing Association (SMEMA).

Providing a dual track system allows for the performance of the circuit board manufacturing process to be improved since the dwell time formerly incurred at the pick and place machine may be eliminated. This is accomplished by providing a second board to a second track of the pick and place machine while the pick and place machine is operating on a first board on the first track. When the pick and place machine completes operation on the first board, it simply moves to the second track without having to wait for a second board to be transferred into its work area.

It should be noted that the dual track system of the present invention has the flexibility of operating as a parallel processing machine, by forwarding two boards through on the track and processing them simultaneously, or alternatively operates on only one track at a time. In addition, the dual track system may be configured to work with robotic loaders, transferring boards into and out of the working nest on only one side of the stencil machine, or additionally may be configured to work with pallets for handling sensitive materials, by forwarding a material on one track to be stenciled, and returning it on the other track. These embodiments will additionally be described below. Suffice it to say that all of these embodiments may be implemented without adding a large amount of additional hardware to prior art stenciling systems. In addition, it will become apparent that the dual rail stenciling system may be optimally used for manufacturing processes where either a top and bottom side of a board are needed to be printed, where a mother and daughter board need to be printed, or for faster processing of one board.

Figure 2:
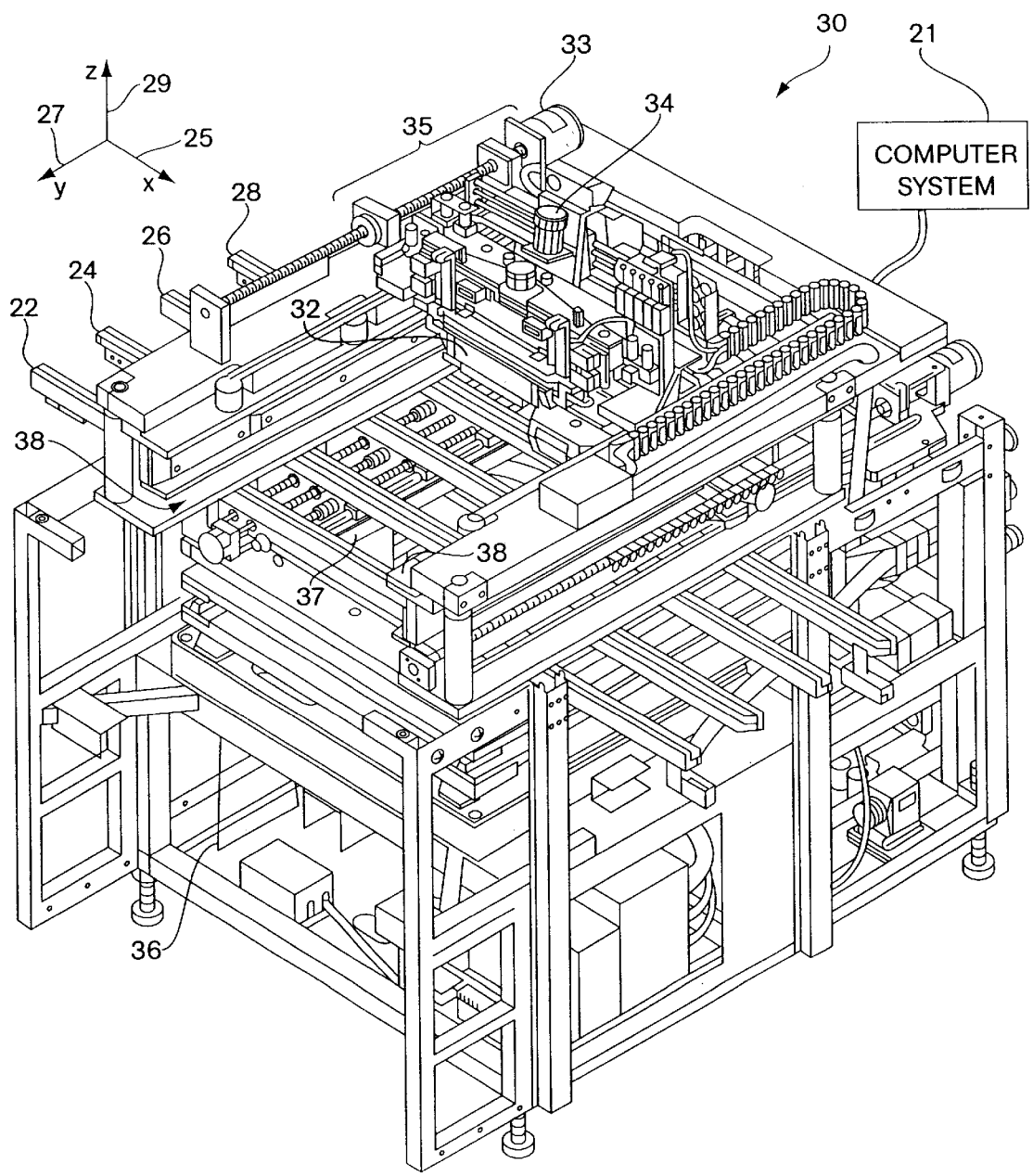
FIG. 2 is a diagram of a stenciling machine for use in the circuit board manufacturing process of FIG. 1.

Referring now to FIG. 2, one embodiment of a stenciling device 30 according to the present invention is shown. The stencil device 30 includes rails 22, 24, 26 and 28. The rails provide movement along the x-axis 25 of circuit boards as they are input to the stencil machine 30. In this embodiment of the invention, each pair of rails, such as rails 22 and 24, form one track. Each rail of each track further includes a conveyor belt (not shown here) on which the circuit board rests as it is propelled through the stencil machine. Each of the tracks are independently controlled for allowing boards on different tracks to be moved to different positions simultaneously.

Area 37 is the "work nest" of the stenciling device 30, which includes a Z-tower (not shown here) for providing movement of the board along the z axis 29. The work nest is the area in the machine at which the stenciling of the board occurs.

A stencil support 38 is included on either side of the rails. The stencil support 38 allows a stencil (not shown) to be inserted in the y-axis 27 and secured above the rails. More details on the stencil will be provided later herein. It should be noted that although herein the term 'stencil' is used, a screen may also be used.

One embodiment of a squeegee arm 35 is shown to include a pivoting squeegee head 32, a squeegee motor 33 and a paste dispenser 34. Although the discussion here will refer to the distribution of solder paste, it should be understood that ink, glue, or other material may also be substituted during material deposition. The squeegee head 32 comprises a pair of blades manufactured from metal, polyurethane or stainless steel, or other such material, and tilts at an angle that allows the solder paste to be dispersed across the stencil. One suitable squeegee head is the Pro-head squeegee available from MPM Corporation of Franklin, Mass. The squeegee arm moves in the y-axis 27 over the stencil and rails. The paste dispenser 34 supplies solder paste to the pivoting squeegee head, generally on an x-axis 25 in line with the rails. It should be noted that while the squeegee head herein is described as having blades, in fact the squeegee head may be any device capable of distributing solder paste through apertures of a stencil.

A vacuum unit 36 may also provided, with separate vacuum hoses (not shown) allocated to each track of the dual track system. The vacuum unit 36 provides suction on the underside of a board in the work nest to maintain the board's position. In alternate embodiments of the present invention, side snubbers or gripping fingers that hold the circuit board (or some other substrate that is to be printed upon) in place during the printing operation may be used in place of the vacuum unit.

Figure 3:
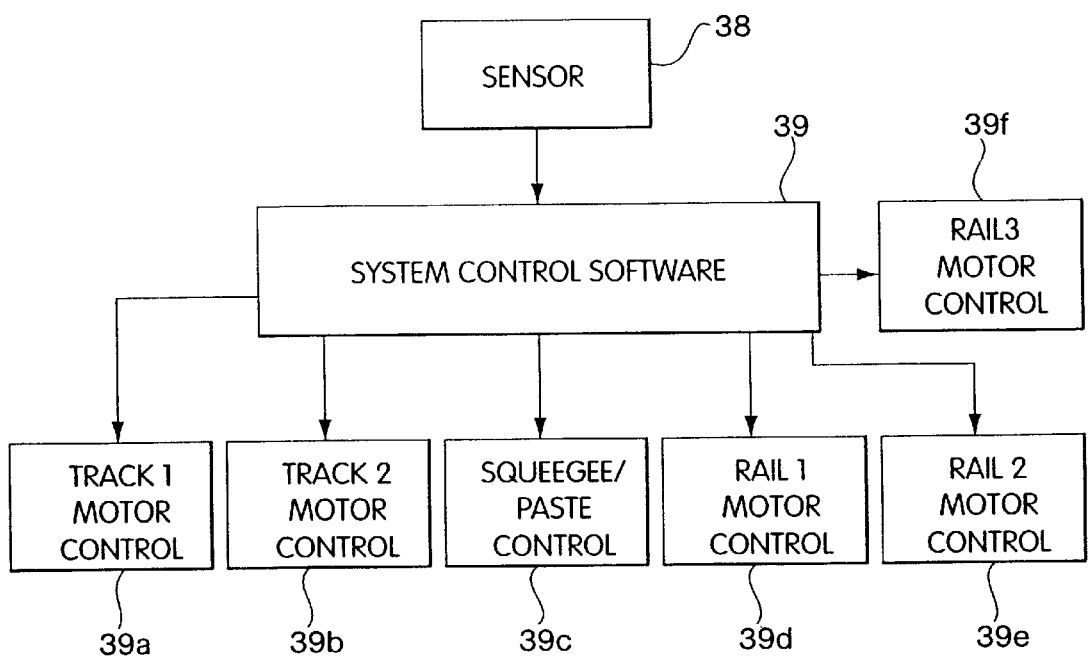
FIG. 3 is a block diagram illustrating the control structure of the stenciling machine of FIG. 2.

The operation of the squeegee arm, the paste dispenser, the pivoting squeegee head, the dual tracks and the vacuum are all controlled via system control software 39 executing on a computer system 21 coupled to the stencil machine. Referring now to FIG. 3, a block diagram illustrating the control structure of the stencil machine 30 is provided. In one embodiment, circuit boards are loaded into the stencil machine from a loader (not shown). A sensor 38, receives indications from the loader of the availability of a board on each of the tracks. In addition, the sensor 38 receives indications from the pick & place machine 16, indicating whether or not the pick and place machine is available to receive boards from the stenciling machine on a given track. The loader, stencil machine, pick and place machine and reflow machine communicate using a SMEMA handshake protocol.

The sensor 38 feeds the status received from the loader and the pick and place machine to the computer system 21 (FIG. 2). The computer system may also receive inputs from a user of the system, indicating, for example, the size of the circuit boards. The computer system 21 is coupled to moveable components of the stencil machine. Depending upon the complexity of the movement of a component, associated with the component is a control device for controlling the operation of an attached motor. The control device is either a complex control device, such as a microprocessor, or a simple programmable logic device, depending upon the complexity of the movement that must be made by the component. The computer system 21, through the system control software 39, issues control signals to each of the controllers, such as track 1 controller 39a, track 2 controller 39b, squeegee/paste controller 39c, rail 1 motor controller 39d, rail 2 motor controller 39e and rail 3 motor controller 39f. The operation of each of these components will be more thoroughly described later herein.

Figure 4:
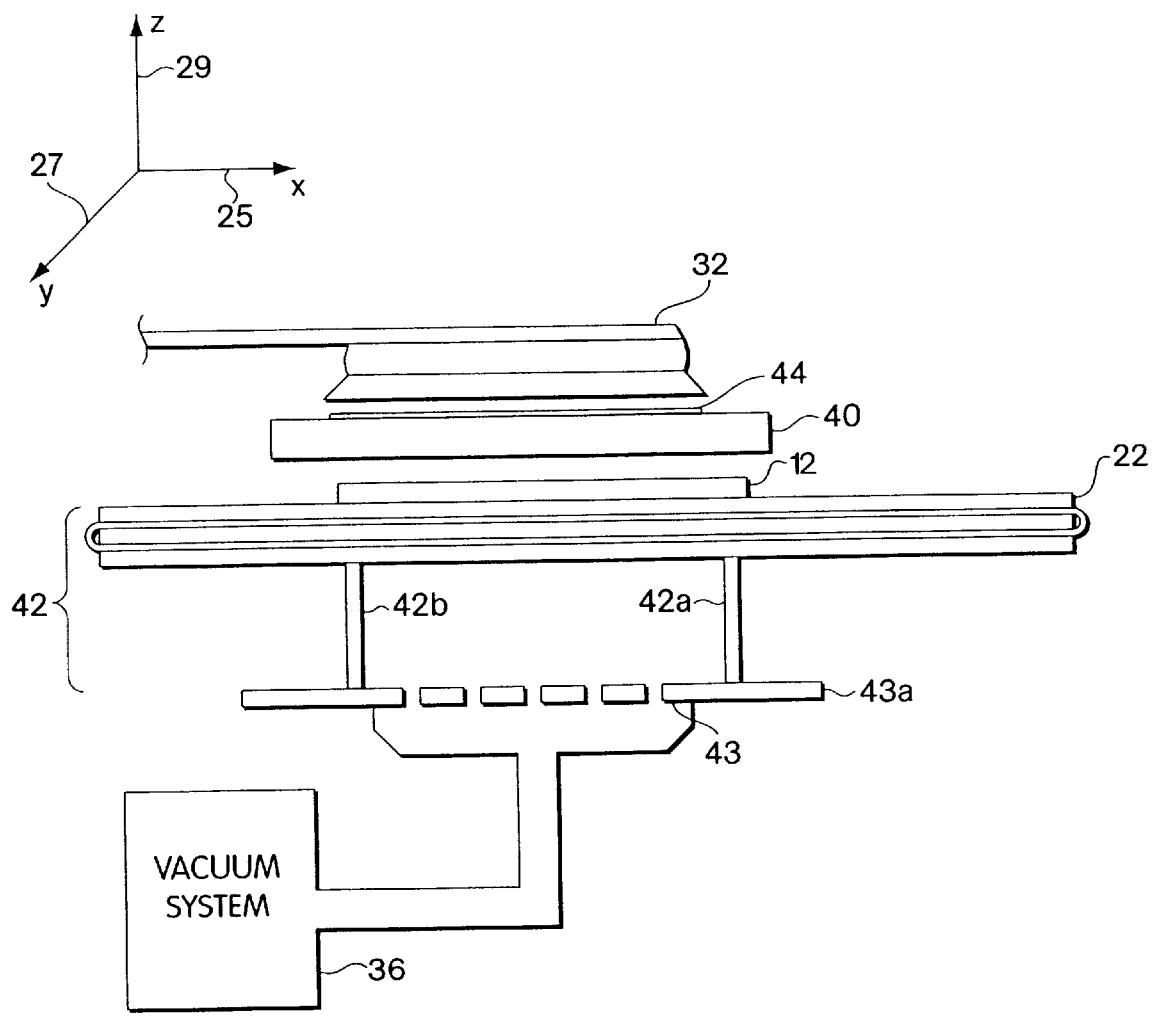
FIG. 4 is a side view in part of the stenciling machine of FIG. 2, illustrating one manner of operating that stenciling machine.

Referring now to FIG. 4, a general description of the operation of one track of the stencil machine will now be provided. Although only one track is described here, the same operation occurs at both tracks when a circuit board at that track is being stenciled. As shown in FIG. 4, the circuit board 12 is forwarded into the stencil machine via conveyor belts, such as conveyor belt 41 of the rail 22, and placed at the proper position above the Z-tower 42. The Z-tower 42 includes a number of supports 42a and 42b as well as advantageously a center support (not shown) to preclude bending of the circuit board during the stenciling process. When the circuit board is slid into the Z-tower by conveyor belt on each of the rails, the vacuum system 36 is turned on to provide a gentle downward pressure on the circuit board 12 for holding the circuit board in position. A porting plate 43 incorporated within a top plate 43a of the Z-tower connects the vacuum system to the air space of the Z-tower. The porting plate 43 may be formed from multiple pieces of stainless steel or other rigid material, and includes a number of apertures through which air flow is permitted. Forming the porting plate from multiple pieces of stainless steel allows for the size of the plate, and consequently the location of the apertures to be altered by simply substituting one of the pieces. The apertures of the porting plate are positioned such that the downward pressure of the vacuum is directed at locations of the circuit board that will center the downward pressure of the vacuum on the board.

As described previously, a stencil 40, slid into the stencil support 38, remains fixed in that location until replaced by another stencil.

When the circuit board is ready to be stenciled, the Z-tower 42 elevates the board on the z-axis above the conveyor belt 41 to contact the board and the stencil. The paste dispenser 34 dispenses a line of solder paste at a location on the stencil adjacent to a pattern on the stencil. Once the solder paste has been placed on the stencil, the pivoting squeegee 32 is stroked across the stencil in the y-axis direction 27 to displace the solder such that the solder is distributed through the apertures of the stencil and onto the circuit board. After the y-axis motion of the squeegee has completed, the circuit board stenciling is complete, and the Z-tower 42 descends in the z-axis to its original position. When the Z-tower has descended to its original location, the circuit board will again rest upon the conveyor belt 41 and will be forwarded out of the stenciling device to the pick and place machine.

Figure 5:
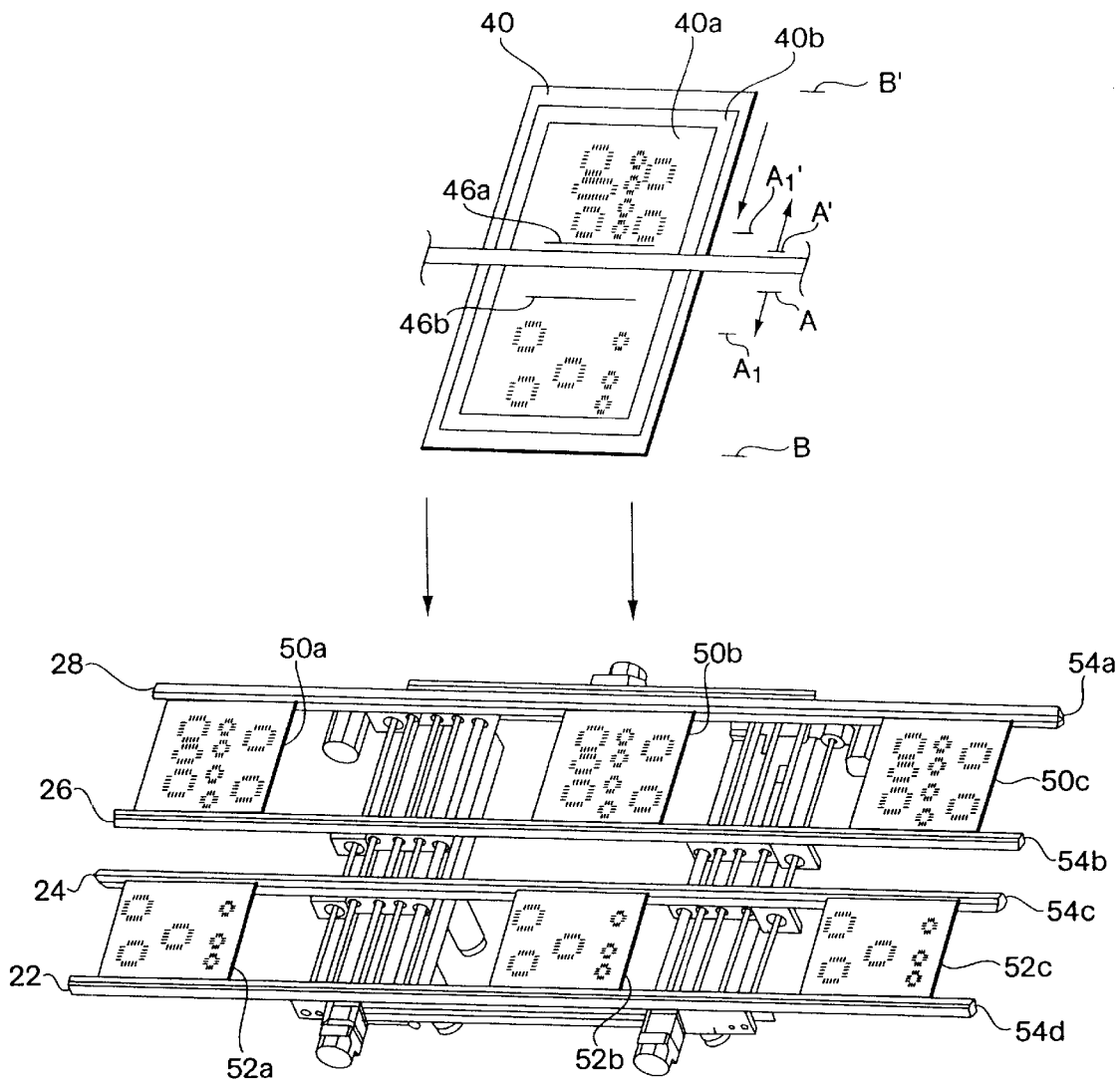
FIG. 5 is a diagram of the rail system of the stencil system of FIG. 2, illustrating the placement of the dual stencil over the dual rails of the stencil system.

Referring now to FIG. 5, it will be appreciated that if there are two circuit boards input on dual parallel tracks, then there are two separate stencil patterns cut into stencil 40. In embodiments of the present invention, stencil 40 is formed by stamping or otherwise forming holes in desired locations on the stainless steel plate 40a. The outer edges of the stainless steel plate are coupled to a resilient polyethylene screen mounted on a stiff aluminum frame. It should also be noted that other materials, such as plastics, may alternatively be used, or that a screen may be used instead of a stencil. The overall dimensions of the framed stencil may be, for example, 29"×35", although these dimensions may vary according to the requirements of the user. The two stencil patterns may either be the same or different. One advantage of the present invention is that it allows for the stenciling of both the top and bottom of a circuit board with one stencil.

In FIG. 5 a number of circuit boards 50a, 50b and 50c, are shown traversing the rails 22–28 during operation. As mentioned previously, the circuit boards lie on conveyor belts surrounding the rails. The conveyor belt may be made of either fabric, rubber, or a similar material. The two tracks, that is track 1 including rails 22 and 24 and track 2 including rails 26 and 28, are each powered separately to allow for separate advancement of circuit boards along the tracks.

Figure 6A:
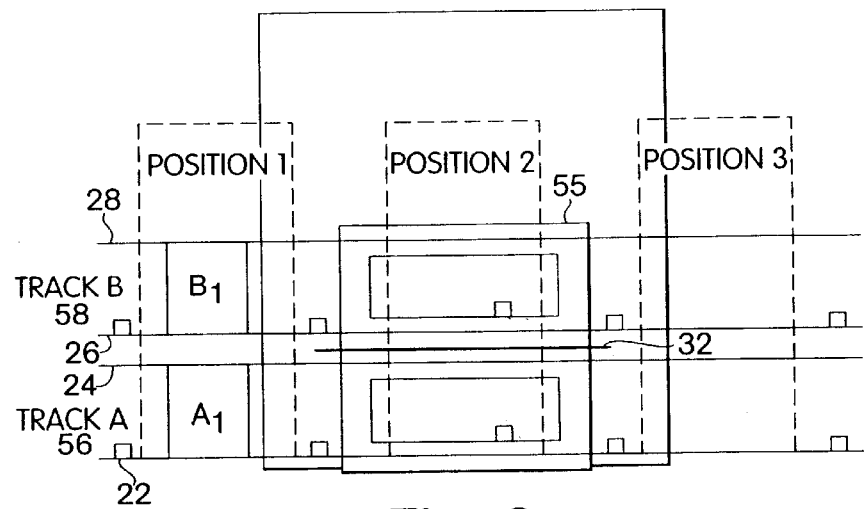
FIGS. 6a–6d are block diagrams illustrating the sequence of handling of circuit boards through the stencil system of FIG. 2.
Figure 6B:
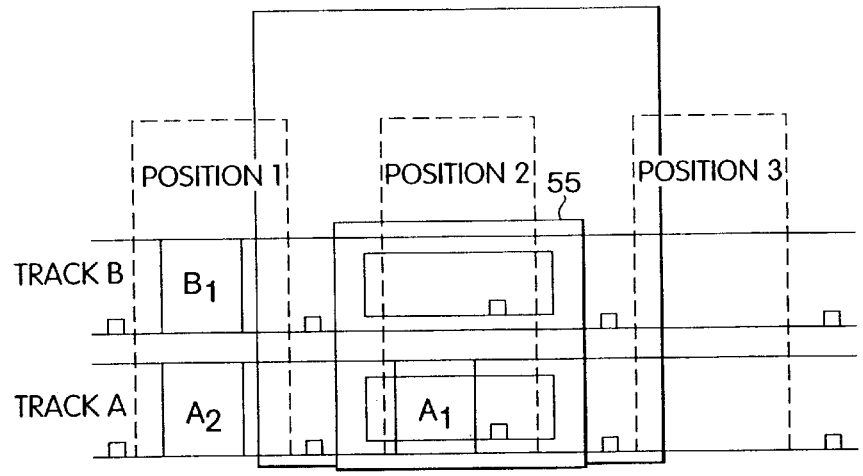
Figure 6C:
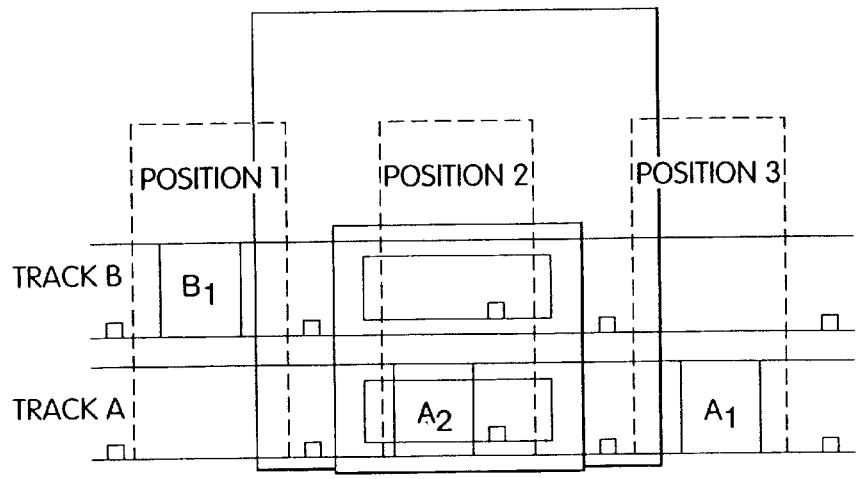

For example, referring now to FIG. 6a, two boards, board A1 and board B1 are shown on respective tracks A and B. The relative operational positions of the board shown in FIGS. 6a–6d are indicated by dashed boxes and labeled position 1, position 2 and position 3. The squeegee head 32 is shown in FIG. 6a positioned in the center of the two tracks. In the embodiment shown in FIGS. 6a–6d, the Z tower, denoted by box 55 in FIG. 6 is formed as one unit spanning both tracks. The Z-tower is raised in the z-axis whenever stenciling needs to be done on either or both of the tracks. In alternative embodiments of the present invention, a separate Z-tower may be provided for each track.

In one embodiment in which the squeegee arm 35 is used, the stencil printing process begins by identifying which track to begin printing on. If there are no boards in the stencil printer, it will accept a board from a board loader (not shown), coupled to each track, and move both boards A1 and B1 to position 1 in the track as shown in FIG. 6a. If the loader on track A has a second board available, then the printer will convey the board A1 on the first track to position 2. Once board A1 has moved to position 2, processing can begin on board A1. As described previously with respect to FIG. 4, the processing begins by elevating board A1 using the Z-tower to bring board A1 into contact with the stencil. Solder is distributed on board A1 by traversing the squeegee head 32 along the y-axis from a position adjacent to rail 24 to a position adjacent to rail 22. While board A1 is elevated off the conveyor belt, board A2 is forwarded to position 1. When the printing on board A1 has finished, the Z-tower will descend and board A1 will again rest on the conveyor belt of track A. Board A1 will move to position 3 and board A2 will move to position 2.

During the next printing cycle, solder is printed on board A2. As described above, the Z-tower will elevate board A2 to bring it into contact with the stencil. The squeegee head 32 will traverse from the position adjacent to rail 22 back to the position adjacent to rail 24 to complete the printing process. During the period of time that A2 is elevated, board A1 may be moved from position 3 to the pick and place machine as the pick and place machine becomes available.

In an embodiment where the Z-tower is one unit spanning both tracks, board B1 is precluded from advancement along track B during the period of time that board A2 is elevated by the Z-tower. Board B1 could be moved into stencil position on the B track before board A2 is elevated, however, unless the system is designed to simultaneously process two boards (as is the case for other embodiments described hereinafter) this may cause undesirable contact between the stencil and board B1.

In an embodiment where there is a separate Z-tower for each track, the advancement of board B1 to the stenciling position may be performed at any time during the advancement or stenciling of the A2 board. Suffice it to say that, in the example shown in FIG. 6d, when board A2 has been processed and the Z-tower is lowered, board B1 may be moved into position 2. At approximately that time, board A2 may be moved into position 3.

Figure 6D:
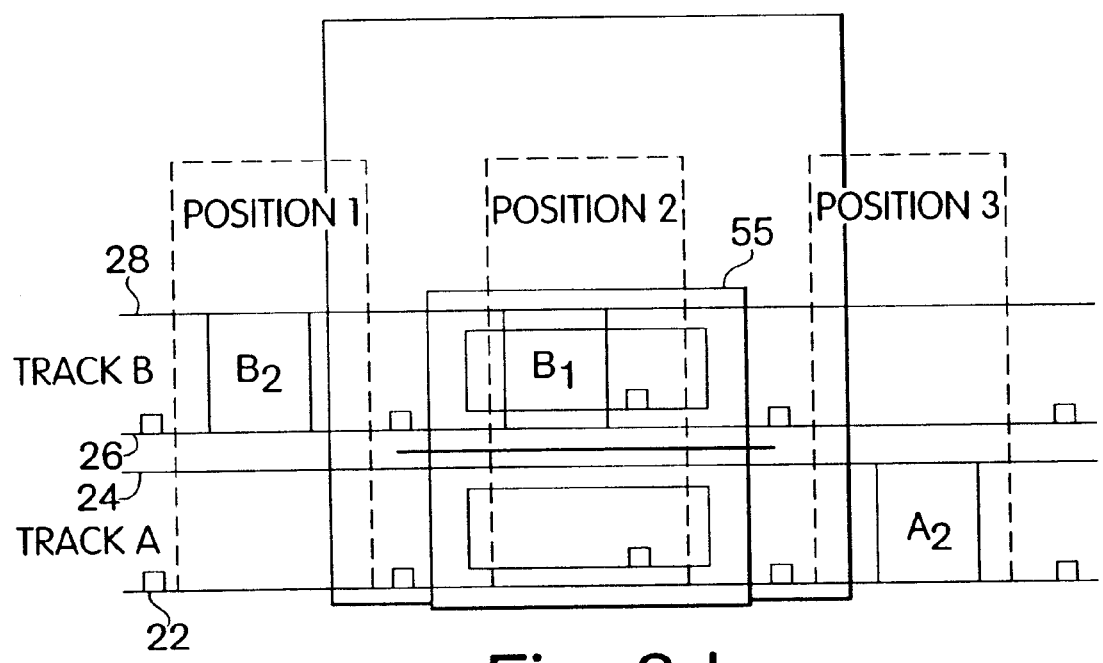

During the cycle that board B1 has moved into position 2 and board A2 has moved into position 3, board B2 may remain in the loader. In a preferred embodiment, after board B1 has been raised by the Z tower 55 to lift board B1 off the conveyor belt, board B2 is advance to position 1 as shown in FIG. 6d.

The above sequence of events will execute continuously provided there are boards available in the loader. However, it is possible that during the print process problems will occur with one or more of the components of the circuit board manufacturing system. The computer system 21 and system control software 39 recognize these problems and adjust the operation of the stencil machine accordingly. For example, if a first board in a set of two consecutive boards is located in position 1, the stencil printer will not allow it to advance to position 2 for printing unless the loader indicates that there is a second board waiting to move into position 1. If the loader does not indicate, through known suitable means (not shown), that there is a second board waiting, the system control software indicates a loader empty situation for the corresponding track and directs the stencil machine to switch to single track printing on the other track. During single track printing, circuit board printing occurs on only one of the tracks. The system control software also modifies the operation of the movement of the squeegee for single track printing to eliminate the squeegee being stroked over stencil patterns under which no circuit board is positioned.

If a board is located in position 1 on a track and the loader indicates that another board is available for processing on the same track, control software executing in the stencil machine will not allow the board in position 1 to advance to position 2 for printing unless there is an open position on the same track of the pick and place machine. The pick and place machine and the stencil machine communicate using a handshake protocol set forth by the Surface Mount Equipment Manufacturing Association (SMEMA). If the pick and place machine indicates to the stenciling machine that there is no open position on that track, control software at the stencil machine detects this as a placement track down situation, and resorts to single track printing on the other track.

Before resorting to single track mode, the stencil printer control software examines status information received from the loader to determine if a backup problem exists on the other track. If it does, the control software interprets this as a slow down associated with outside influences, such as unavailability of boards. In such an event, the control software waits in dual track mode and proceeds printing on the first track that becomes free.

While in single track mode, the stencil printer control software monitors the information received from the loader and from the pick and place machine, and reverts back into dual track mode when possible. This change back occurs when the squeegee head is located in the center of the stencil.

If the second set of two consecutive boards is in position 3, and control software determines (in response to signals received from the pick and place machine) that it is unable to move to the pick and place machine, the stencil machine does not load another board into position 1. Rather, the stencil machine views this as a track down situation and resorts to single track printing on the other track.

If, at a given track, one board is in position 2 and a second board is in position 3 but is unable to move to the pick and place machine, the stencil printer control software will be unable to move the printed boards out of position 2 and will resort to single track printing on the other track. In this case, the stencil printer control software will signal that manual intervention is required and begin single track printing on the other track.

In an alternative embodiment of the present invention, to avoid the need for manual intervention in the above-described situation, a pin located between the rails is raised in response to a command from the computer system. The track is then moved backwards to move the board in position 2 to position 1. The pin prevents the board at position 3 from moving back into position 2. The stencil machine can then continue operation in single track mode.

If, at a given track, one board is being printed in position 2 and the stencil printer control software determines that a second board is unable to exit the loader and enter position 1, the stencil printer control software may call for manual intervention to load the second board. Alternatively, the control software may advance the first board to position 3, return the squeegee head to the center of the stencil, and begin single track printing on the other track.

It should be noted that all of the above protocols are implemented using a system control software program that controls the motors of the conveyor belt of the rails and the positioning of the squeegee head. In addition, the system control software interacts with the adjoining components of the circuit board manufacturing system according to a SMEMA handshake protocol.

Referring back briefly to FIG. 5, one method of moving the squeegee arm 35 across the stencil will now be described. In one embodiment of the invention, the processing order of the boards as they are forwarded through the stencil printer is dictated by the location of the squeegee head relative to the two stencil patterns. For example, as shown in FIG. 5, the squeegee head is centered above the two patterns of the stencil when it is in its start up or "home" position. The paste dispenser places two beads of solder paste (or some other similar material) 46a and 46b adjacent to each respective pattern on the center portion of the stencil.

During operation, the squeegee head 32 moves, for example, to print on board A1 as described in FIG. 6a, from position A to position B (shown in FIG. 5). As mentioned previously, in one embodiment, the squeegee head comprises a pair of blades which are positioned over the stencil's surface. It should be noted that, in an alternative embodiment, the blades may be independently movable up and down to engage and disengage from the stencil's surface, with one of the blades being inclined or tilted along the y-axis for motion in one direction and the other of the blades being inclined or tilted along the y-axis, for motion in the other direction.

The computer system 21 causes an operation to tilt the squeegee head along the y-axis to allow a first one of the squeegee blades to contact the solder paste. The second blade is lifted off from the solder paste engaging position on the stencil's surface. In this embodiment as described, the solder paste is positioned between and travels between the blades. The squeegee head strokes the solder paste across the stencil to thereby dispense solder through the apertures of the pattern and onto board A1. After processing of board A1, the squeegee head will be in position B. At this point, there is solder remaining between the blades of the squeegee head that is to be used to process board A2.

If there is no second board on track A to be processed, squeegee head 32 is moved from position B to position A' (for processing boards on track B). This transition preferably occurs without dragging the wiper blade across the stencil, since such an operation would cause the solder to be stroked over apertures of the stencil when there was no board in position. In addition, it is undesirable to lift the blade and move to position A', since solder would remain at position B that may ultimately become dry and non-viscous, thereby compromising the integrity of the stencil. Further, if the blade is lifted, paste may drip from the blade as it is moved to position A'. Embodiments of the present invention are capable of performing such a lifting and moving operation of the blades when necessary for maintaining system performance. However, for the reasons described above, this should be minimized.

Thus, for the above reasons, when using the squeegee arm 35, it is advantageous to process the boards in the order described above with reference to FIGS. 6a–6d. Using the order described above, when board A2 is advanced to the stencil position, squeegee head 32 will tilt along the y-axis to move the first blade of the squeegee head off from the solder-engaging position and to enable the second blade of the squeegee head to stroke the solder from position B to position $A_1$ in FIG. 5. The solder paste for processing board A1 is located between position A and position $A_1$.

The squeegee head then lifts the blades and moves from position $A_1$ to position A' on track B, thereby jumping over solder line 46b and avoiding contact pressure on the center of the stencil. The squeegee head operates in a similar manner at track B, moving from position A' to B' for processing board B1, and from position B' to $A_1'$ for processing board B2.

In an alternative embodiment, two independently movable squeegee heads may be disposed above the stencil 40 with two stencil patterns cut into the stencil, as shown in FIG. 5. In this alternative embodiment, the two squeegee heads, which may be constructed or described above, may each be independently stroked over a respective stencil pattern in the same directions of movement of head 32 shown in FIG. 5. The rest or "home" position of the two squeegee heads may be either between the two stencil patterns or outside both stencil patterns. In this alternative arrangement, two circuit boards may be processed or stenciled at the same time if, of course, two circuit boards are in position to be processed. Further, in this alternative arrangement, the sequence described above and shown in FIGS. 6a–6d may be modified to simultaneously deliver circuit boards to the area of the stencil machine at which processing occurs. Alignment of the two circuit boards may be performed by the optical alignment step described above or with the mechanical fixturing device described in further detail below.

According to another embodiment of the invention, the dual track stenciling system illustrated in FIG. 2 may be modified such that the squeegee arm 35 is replaced with a solder gathering squeegee arm 135 that allows for solder to be both disposed of and gathered for each stroke on the stencil. By providing a solder gathering squeegee arm that is capable of both disposing and gathering solder for each stroke across the stencil, the performance of the dual track stenciling system may be enhanced because both of the circuit boards in the work nest may be processed in series, without requiring the time consuming elevation and de-elevation of the Z-tower.

Figure 7:
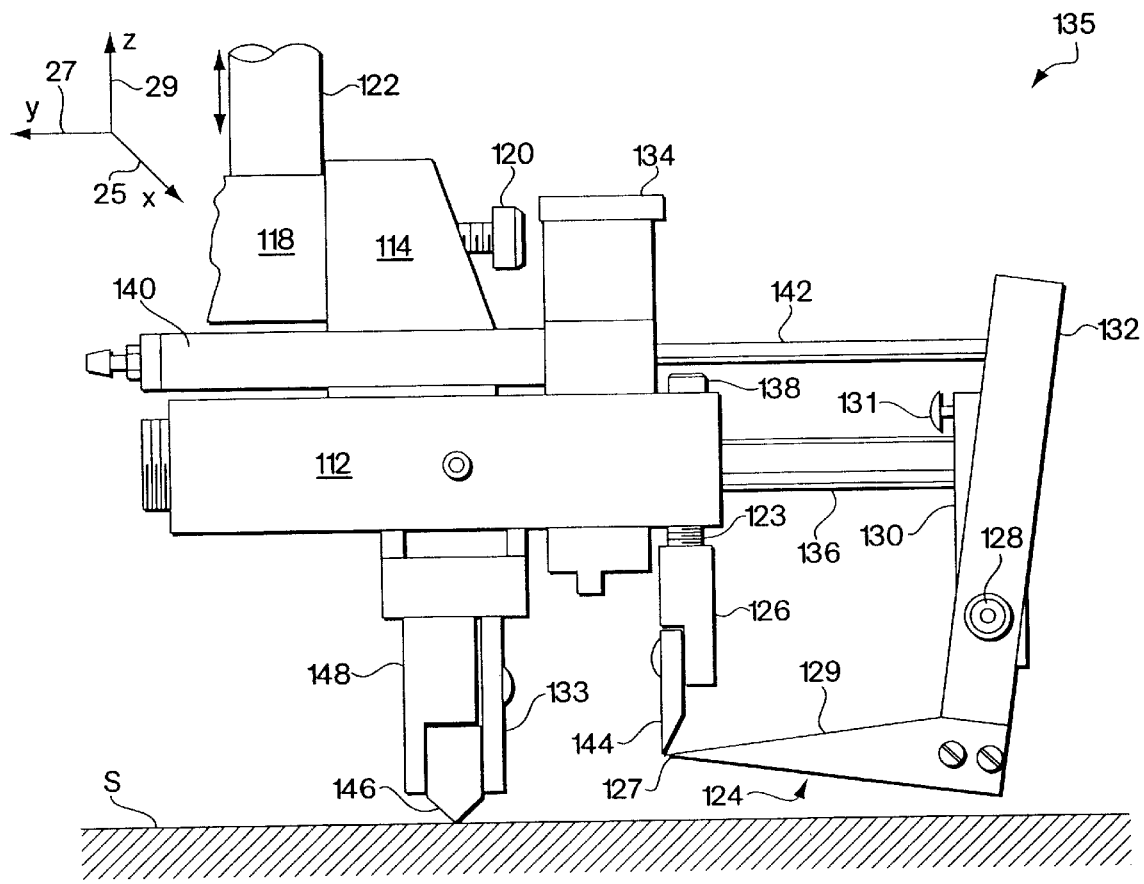
FIG. 7 is a diagram illustrating a solder gathering head for use in the dual track stenciling machine of FIG. 2.

For example, referring now to FIG. 7, one embodiment of a solder gathering squeegee arm 135 that may alternatively be used in the stenciling system of FIG. 2 is shown. The solder gathering squeegee arm 135 operates to both dispense solder and retrieve excess solder in each stroke. The solder gathering squeegee arm 135 is moveable in the y and z axes. The solder gathering squeegee arm moves in the y axis to traverse from the front of the stenciling machine to the rear of the stenciling machine (and visa versa) to stroke solder across the stencils and onto the circuit boards in the work nest of the stenciling machine. The solder gathering squeegee arm 135 also moves in the z axis for engaging and disengaging the squeegee blades 146 and 152 with the surface of the stencil. One advantage of using the solder gathering squeegee arm is that the dual track stenciling system is not limited to processing circuit boards as described in FIGS. 6a–6d above. In the processing sequence described in FIGS. 6a–6d, two boards were processed on each track before switching to the next track because of the way in which the solder paste was dispensed. In the embodiment of FIGS. 6a–6d, the solder is pushed in front of the squeegee blade. When the blade 32 has pushed the solder to the position prior to stenciling of the A2 board of FIG. 6b, there is no way that the board B1 may be next printed prior to printing the A2 board. This is because there is no mechanism to move the solder to a position to print board B1. Thus, in the embodiment of FIGS. 6a–6d, there is not complete versatility.

However, by using the solder gathering squeegee arm 135, because it both dispenses and gathers solder on each stroke, any variety of processing sequences may be utilized in the dual track stenciling system. In FIG. 7, an exemplary embodiment of the solder gathering squeegee arm 135 is shown to include a carriage 112. The solder gathering squeegee arm 135 is described in detail in U.S. Pat. No. 5,044,306 and incorporated herein by reference. The carriage 112 carries the squeegees 146 and 144 and the paste dispensing unit 134. The paste dispensing unit 134 extends through the carriage 112, and dispenses solder paste between the pair of squeegee blades 146 and 144. Squeegee blade 146, hereinafter also referred as a wiping squeegee, is made of polyurethane and is replaceably secured in a bracket 148 by a block 133. The bracket 148 depends from and is moveable with the carriage 112. During operation, the wiping squeegee 146 wipes solder paste across the surface of the stencil. In addition, at the end of a solder paste stroking operation, the wiping squeegee 146 is used to move excess solder paste into a solder gathering head 124, as will hereinafter be described. The second squeegee 144, hereinafter also referred to as a distributing squeegee 144, is made preferably of Teflon and is replaceably secured by screws to a squeegee holder 126. The squeegee holder 126 is free floating against the force of a spring 123 coupled to the carriage 112. Once adjusted to a desired position, the distributing squeegee 144 remains fixed to the carriage for reciprocation back and forth above the surface of the stencil. As will be seen below in the description of the operation of the solder gathering squeegee arm, the distributing squeegee primarily acts to retain solder between the blades, and is not a necessary element of the solder gathering squeegee arm.

The carriage 112 is coupled to a boss, 114, to which includes a slot which adjustably receives an arm 118. The arm 118 is propelled by the squeegee motor 33 (FIG. 2). The squeegee motor controls the advancement of the arm 118, and consequently the solder gathering squeegee head 135 in the y axis direction. Also coupled to the boss 114 is a z-axis control beam 122. The z-axis control beam is moveable in the z-axis direction. As will be described in more detail below, the z-axis control beam is also controlled by the squeegee motor 33, for elevating and lowering the solder gathering squeegee arm 135 during the stenciling operation.

A solder gathering head 124 is attached via a moveable piston and rod pair 140 and 142, and a moveable rod 136 to the carriage. The solder gathering head 124 may includes a plate portion 127 and side pieces 129 to retain solder within the solder gathering head. Accordingly, the solder gathering head 124 is generally shaped like a shovel. The solder gathering head 124 is pivotally mounted on pins 128 on an inverted U-shaped frame member 130 by a slightly larger U-shaped frame member 132, surrounding the frame member 130. The shovel portion of the solder gathering head 124 is thus secured to the low end of the frame number 132 as shown in FIG. 2. Coupled to the frame member 130 is a stop pin 131. The frame member 132 (and consequently the shovel portion of the solder gathering head) pivots on pins 128 until the frame member 132 engages the stop pin 131.

The rod 136 acts to propel the frame member 30, and hence the solder gathering head 124, towards and away from the carriage 112. The rod 136 is fixed to the frame member 130 and side and horizontal bores in the carriage 112. Thus, the solder gathering head 124 moves towards and away from the carriage 112 as the rod 136 slides into and out of the carriage 112.

According to one embodiment, a pair of air cylinders 140 or other equivalent means are mounted on the carriage 112. Pistons 142 extend from the cylinders and are fixably attached to the frame member 132. When activated by the squeegee motor 33 (FIG. 2), the pistons 142 rotate the solder gathering head 132 around the pins 128, to cause the shovel portion of the solder gathering head to pivot with regard to the stencil to scoop solder off of the screen during operation.

Figure 8C:
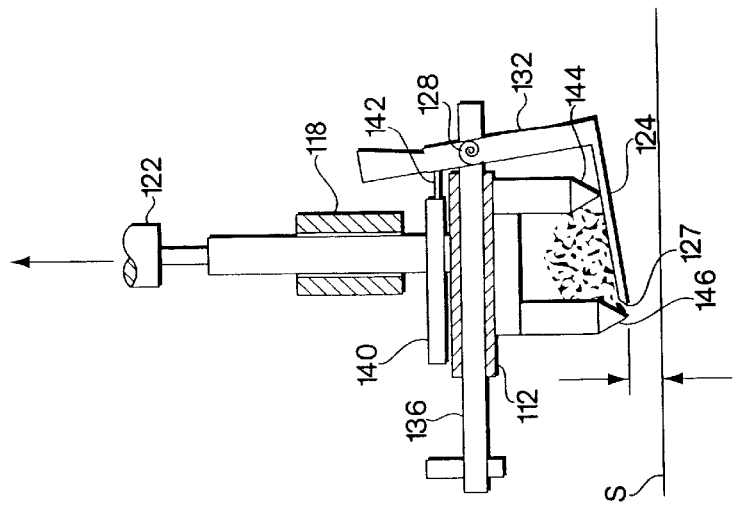
FIGS. 8a–8c are diagrams illustrating the operation of the solder gathering head of FIG. 7.

For example, referring now to FIGS. 8A–8C the operation of the solder gathering squeegee arm 135 will now be described. In FIG. 8A, the paste dispensing unit (not shown here for purposes of clarity) has deposited solder paste between the wiping squeegee 146 and distributing squeegee 144. The pistons 142 and the cylinders 140 are extended to maintain the solder gathering head 124 away from the squeegees 146 and 144. The squeegee motor 33 (FIG. 2) is actuated to cause the carriage 112, and consequently the squeegee 146 to move across the stencil S, dispersing solder onto the circuit board.

Figure 8B:
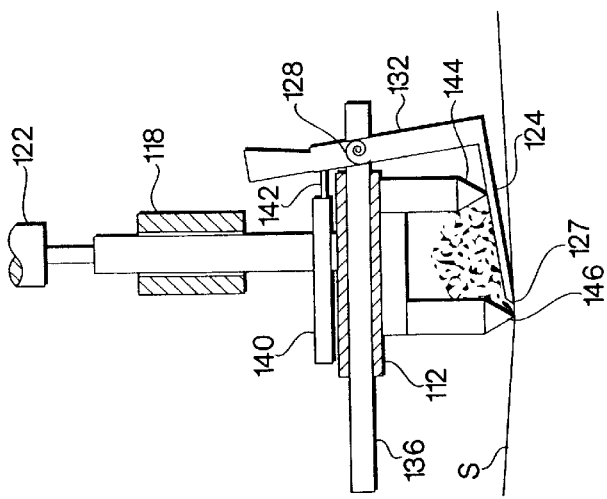
Figure 8A:
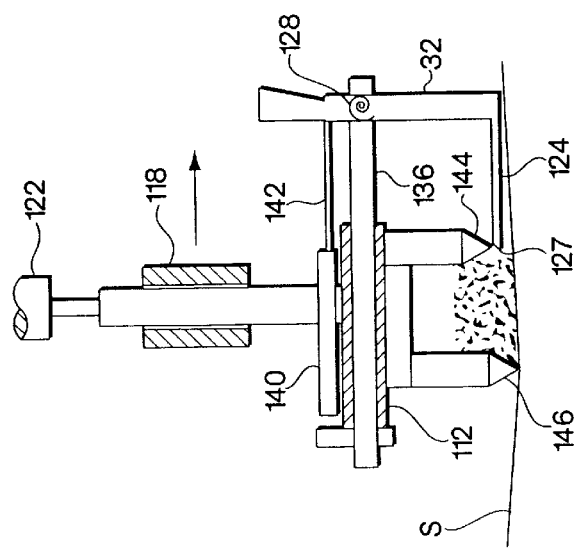

In FIG. 8B, at the end of the stroke when one circuit board has been processed, rod 136 is moved by the squeegee motor to move the frame member 130 towards the carriage 112. In addition, the piston and rod arrangement 140 and 142 move the top of the frame member 132 towards the carriage such that the solder gathering head 124 slides at an angle beneath the distributing squeegee 144 to meet with the wiping squeegee 146. As the solder gathering head is propelled towards the carriage by the rod, the piston/rod pair 140/142 cause the solder gathering head to rotate on the pivoting pins 128 as shown in FIG. 8B to effectively lift the solder off of the base of the screen. The unused solder paste is retained by the wiper squeegee 146 and effectively swept onto the solder gathering head 124 and retained by the distributing squeegee 144.

Since the first circuit board has been completed, the solder gathering squeegee arm is advanced either to the board in the other track of the dual track stenciling machine or to a board on the same track; i.e., there is no limitation as to which board need be processed next, because the solder for stenciling the board is retained in the solder head, rather than being disposed on the screen surface. As shown in FIG. 8C, the solder gathering squeegee arm 135 is elevated off of the screen and moved to the proper position to process the next selected stencil. Elevating the solder gathering squeegee arm in such a manner advantageously reduces the wear and tear on the stencil. When the position for processing the next circuit board has been reached, the solder gathering head descends to engage the squeegees with the stencil for the next stroke.

Figure 9A:
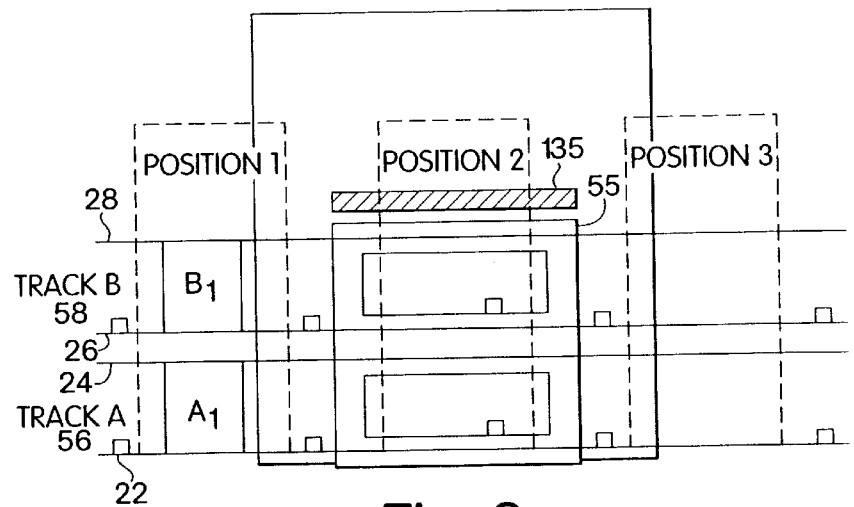
FIGS. 9a–9e are blocked diagrams illustrating the sequence of handling of circuit boards in the stenciling system of FIG. 2 using the solder gathering head of FIG. 7.
Figure 9B:
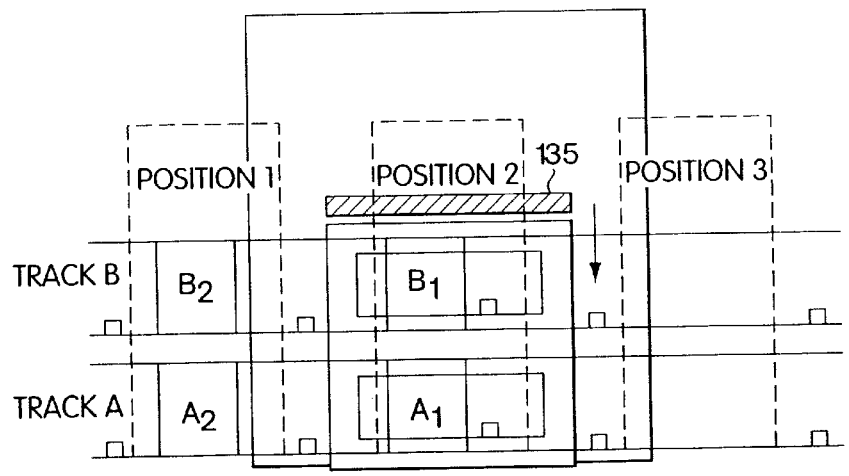
Figure 9C:
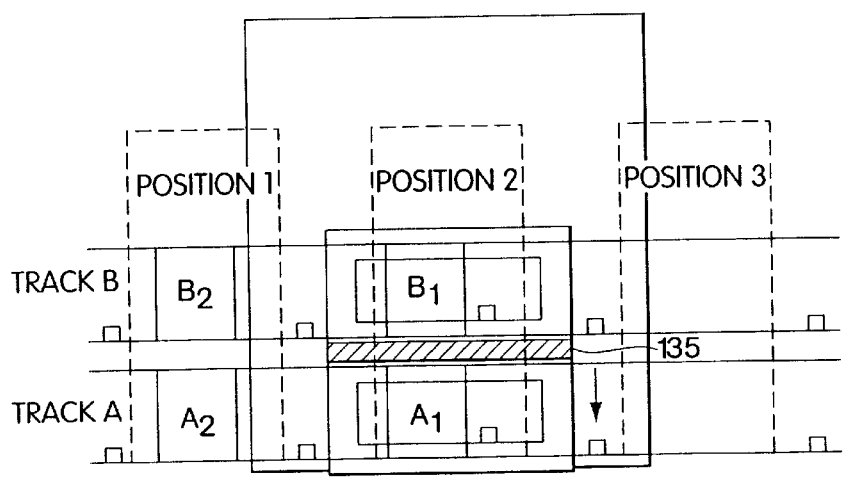
Figure 9D:
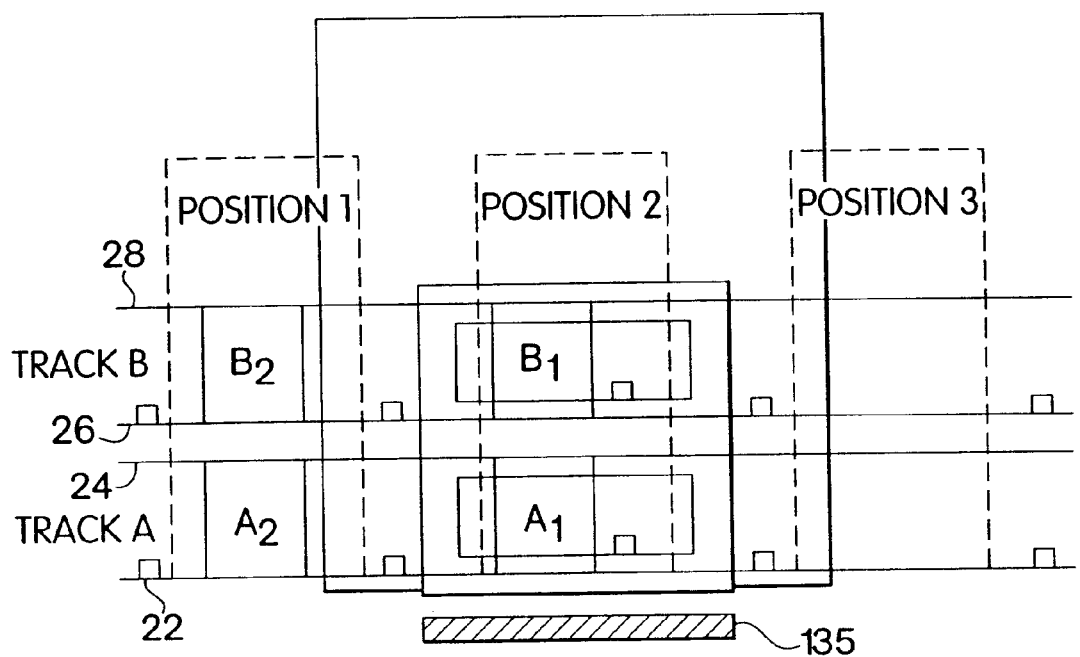
Figure 9E:
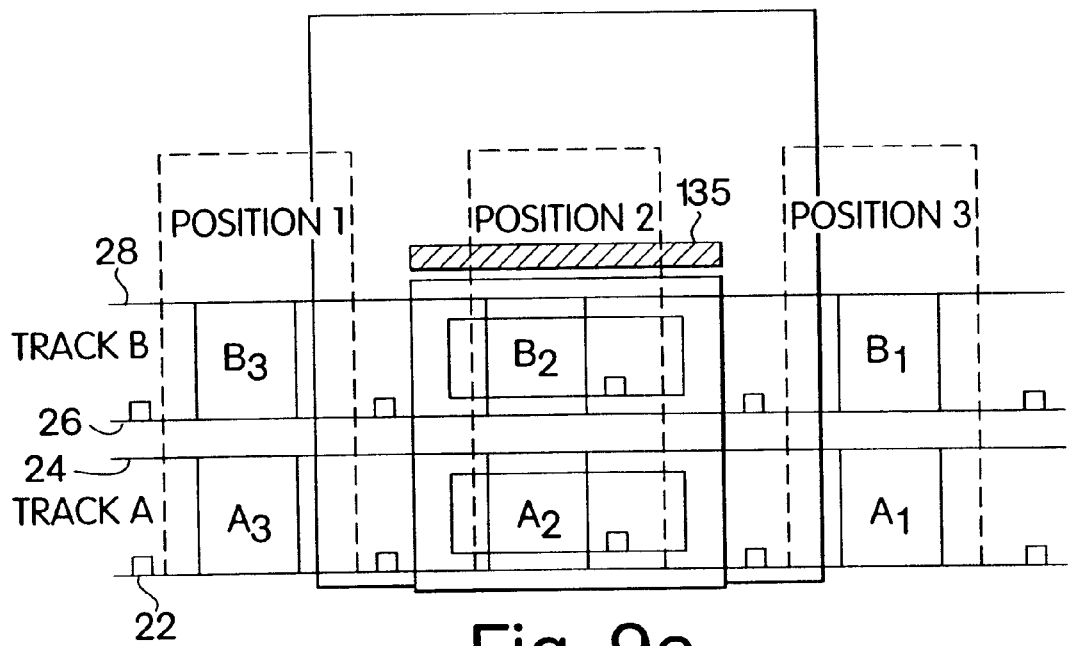

In addition to allowing for flexible processing sequences, using a solder gathering squeegee head such as that described with regards to FIGS. 7 and 8A–8C enhances the performance of the dual track stenciling system because the processing may be performed serially on each of the boards, without raising and lowering the z-tower between board processing. For example, by referring now to FIG. 9a, one method of stenciling two circuit boards in the dual track stenciling system of FIG. 2 using the solder gathering head of FIG. 7 is shown. As in FIGS. 6A–6D, the relative operational positions of the boards shown in FIGS. 9A–9E are indicated by dashed boxes and labeled position one, position two and position three. In FIG. 9A boards A1 on track A and A1 on track B are moved into position 1. At this point the solder gathering squeegee arm 135 is positioned at the rear of the stenciling machine, adjacent to board B1. In FIG. 9B boards A1 and B1 are moved to the position two; i.e., to the working nest, of the dual track stenciling system. At or about this time boards B2 and A2 are moved into position 1. Once boards B1 and A1 are in position 2, the process of dispensing solder paste on the stencil, and consequently on the circuit board, begins. The squeegee arm is lowered to engage the stencil and solder paste is dispensed between the squeegee blades 146 and 144. During the first stroking motion the solder gathering squeegee arm 135 advances from the position as shown in FIG. 9B to that position shown in FIG. 9C, where it is located between the two boards. At this point, because it is advantageous to reduce the wear and tear on the stencil, the squeegee arm is elevated (as described with regard to FIG. 8C) and advanced to a starting position for board A1. During the next stroking motion the board A1 is stenciled and the squeegee arm 135 advances to that position shown in FIG. 9D. At this point, the A1 and B1 boards have both been stenciled and the solder gathering squeegee arm may return to its start position. While the solder gathering squeegee arm 135 is being returned to the start position, the Z-tower is lowered allowing boards B1 and A1 to move to position 3 and boards A2 and B2 to move to position 2 as shown in FIG. 9E. The process thus begins again for stenciling boards A2 and B2.

Although in the above embodiment the squeegee arm is shown moving back to an original position, in another embodiment, the solder gathering squeegee arm may also be 180 degrees rotatable, to allow for stenciling of boards to progress in both directions on the y-axis. Using a rotatable solder gathering squeegee arm would thus remove the step of returning the squeegee arm to its originating position while a new pair of boards is being forwarded into the work nest. In addition, using a rotatable solder gathering squeegee arm would also allow for the processing sequence, described with regard to FIGS. 6A–6D to be used, with the solder gathering squeegee arm rotating after each stroke of the board, to process two boards in each rail before advancing to the other rail.

Accordingly, a flexible dual track stenciling system has been described that utilizes a solder gathering squeegee head that ensures that there is no limitation as to which board or which track need be processed next, since the solder for stenciling boards is retained in the solder head, rather than distributed on the screen. In addition, the solder gathering head allows for a processing sequence that has enhanced performance, since the Z-tower need only be elevated once for the processing of two boards. In an alternative embodiment, the solder gathering squeegee head is rotatable to allow for stenciling to occur in either y axis direction, thus increasing the variety of processing methods available in the dual track stenciling system.

Figure 10A:
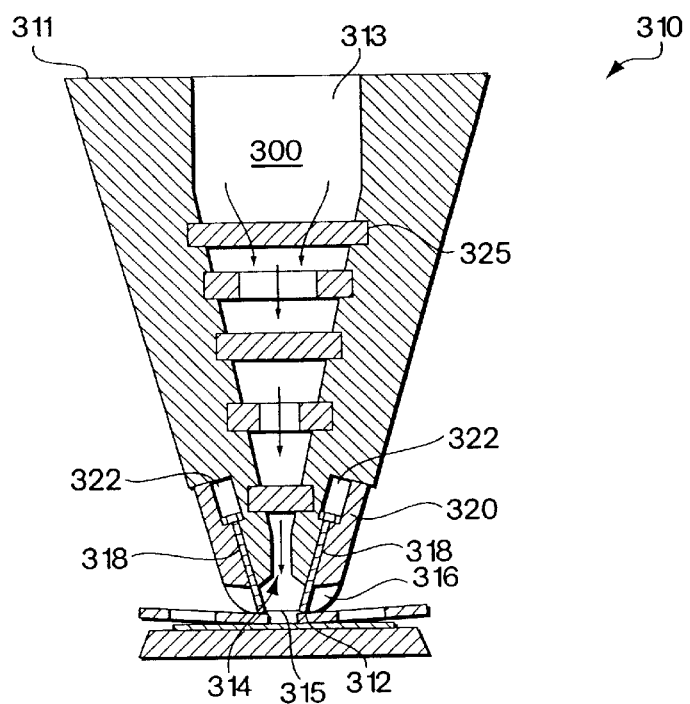
FIGS. 10a–10c are block diagrams illustrating multiple embodiments of solder dispensing heads for use in the dual track stenciling machine of FIG. 2
Figure 10B:
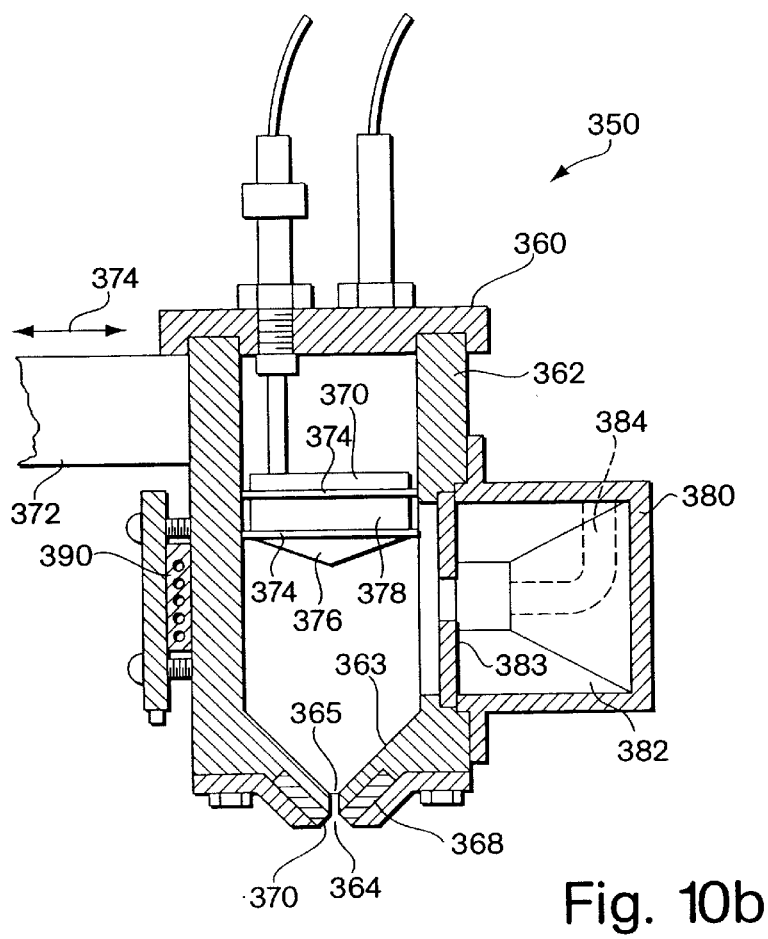
Figure 10C:
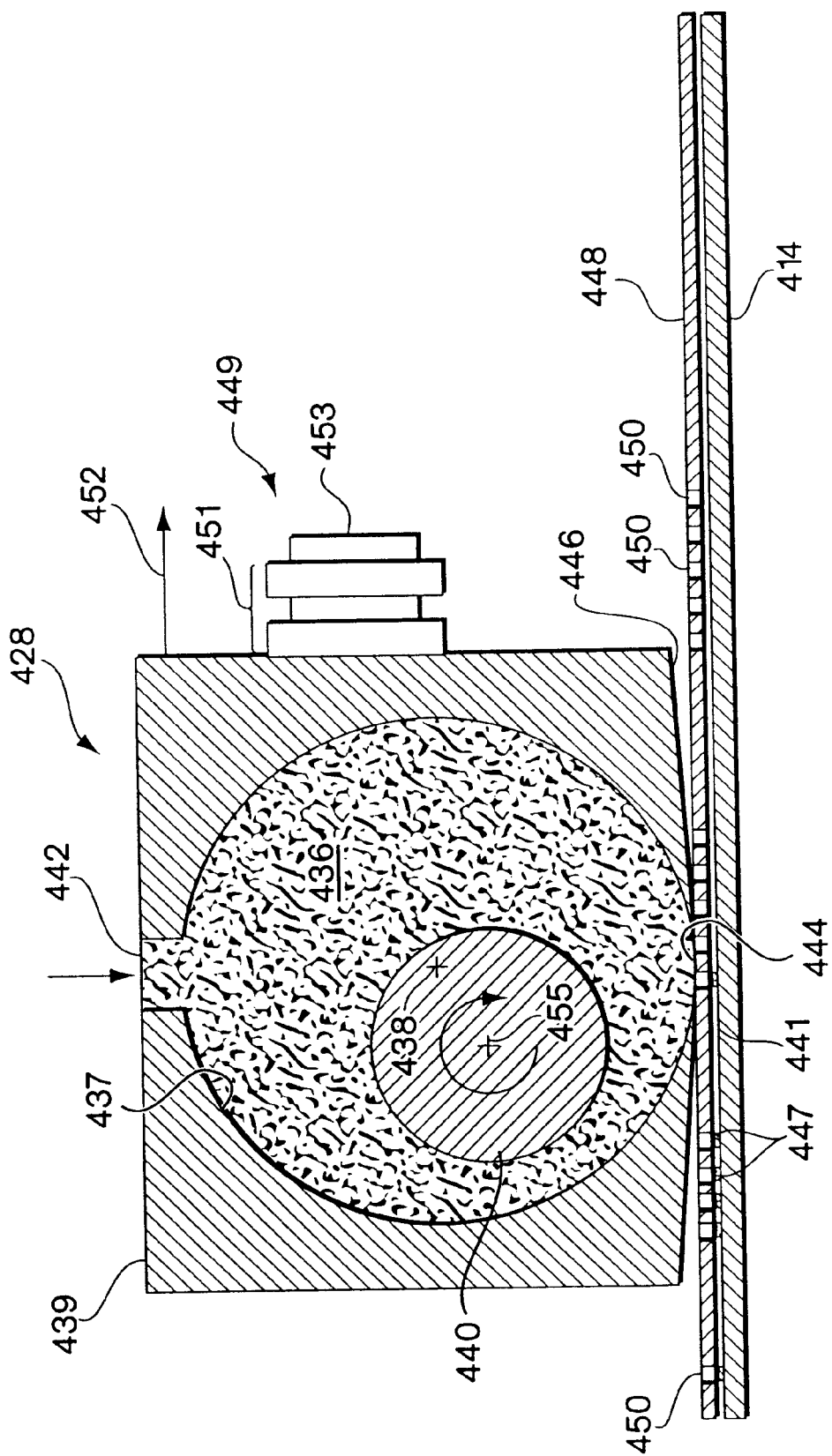

Referring now to FIGS. 10A–10C, a number of embodiments of a solder dispensing head that may be used in the stenciling machine of FIG. 2 are shown. The solder dispensing head 310 of FIG. 10A is described in detail in PCT Patent Application Publication No. WO 96/20088 entitled METHOD AND APPARATUS FOR DISPENSING VISCOUS MATERIAL, filed Dec. 21, 1995 by Ford Motor Company Limited, and incorporated herein by reference. The solder dispensing head 310 operates generally as follows.

The solder dispensing head 310 may be formed from metal such as iron, stainless steel or other material suitable for use with pressurized viscous material such as solder paste. The solder dispensing head 310 includes a top surface 311 to which a syringe housing (not shown) containing a viscous material such as solder paste may be attached. The syringe housing is coupled to express solder 300 into a tapered interior cavity 313 of the solder dispensing head in response to a pressure source (not shown). The pressure source may operate mechanically, electrically or hydraulically to meter out viscous material from the syringe housing or other reservoir. In addition, pneumatic pressure may be used directly to force the viscous solder material from a reservoir housing through to the solder dispensing head 310.

The tapered interior cavity 313 includes diffusers 325. The diffusers 325 and the tapered shape of the interior cavity 313 act to slow rate of progression of the solder through the interior cavity 313. The tapered interior cavity 313 terminates in a generally rectangular exit 314. A volume 312 of solder is expressed from the rectangular opening 314 and propelled through a substantially uniform opening 315 that is defined by a compression head cap 320. The compression head cap 320 is formed from contiguous walls which define the volume 312 of solder within the solder dispensing head 310. The compression head cap 320 may be either unitary or formed from separate elements and is designed to contact a stencil to provide a uniform and substantially flush union with a stencil at the point of contact.

Thus, the solder flows into the compression head cap 320 after exiting the interior chamber 313 of the solder dispensing head 310, and the compression head cap 320 acts to contain and direct the flow of solder into the stencil. As shown in FIG. 10A, the compression head cap 320 includes rectangular blades 318 and an end cap 316 which defines generally the rectangular opening 315. In one embodiment, the blades are thin and formed from rigid materials such as iron and stainless steel. The blades 318 advantageously operate to shear off the solder contacting the stencil within the compression head cap 320 when the apparatus is horizontally disposed across the stencil. The blades are rigid and angled to advantageously achieve a smooth shearing of the solder material. The end caps are formed from a flexible surface such as polyurethane to avoid damage to the stencil during operation. Blades 318 and end cap 180 are each fixably mounted to the compression head cap 320.

The compression head cap 320 provides a contained environment to direct and to aid in the extruding of the pressurized solder through openings in the stencil. The extruded solder is then deposited on the pattern of the printed wiring board. Thus, the solder dispensing head 310 provides for a very high speed printing capability while maintaining print definition and reducing the stenciling cycle time. The amount of solder paste that is wasted during the stenciling process is minimized due to the contained environment provided by the compression head cap 320. The length of rectangular opening in the head cap allows for compression printing through a plurality of openings in the stencil to occur simultaneously. The compression head cap 320 is advantageously rectangular in shape so that it may operate over a significant area of the stencil with each pass.

During the stenciling operation of the circuit board, the solder dispensing head 310 is brought into contact with the top surface of a stencil to force the stencil downward until it is an intimate contact with the circuit board below and moved in a across the stencil. During movement of the solder dispensing head, the pressure source acts on the syringe housing to force the solder material from the syringe housing into the interior cavity 313 of the solder dispensing head 310 where it is diffused by diffusers 325 and directed to the rectangular exit 314. The viscous material then enters volume 312 of the compression head cap 320 which provides a contained environment via blades 318 and end caps 316 to direct the pressurized viscous material to the top surface of the stencil. The viscous material is then extruded through openings in the stencil over which the compression head cap travels, and is printed on the printed wiring board. Movement of the compression head cap 316 across the stencil surface causes the trailing blades 318 that are angled inwardly relatively to the interior chamber 313 to shear off the viscous material from the top surface of the stencil. Once the solder dispensing head has traversed the length of the circuit board, the solder dispensing head 310 reverses its direction and continues the compression printing process.

The process used to stencil a circuit board using a compression type head such as the solder dispensing head 310 is different than the processes described with regards to FIGS. 6A–6D and 9A–9E, since, in general, the width of the tip of the solder dispensing head is generally narrower than the width of the circuit board being processed. Accordingly, multiple passes of the solder dispensing head 310 are often undertaken to stencil the entire circuit board. However, like the solder gathering head embodiment described with regards to FIGS. 7 and 8, the solder paste is retained within the solder dispensing head, and thus the stenciling machine is free to process circuit boards in any desired order.

Referring now to FIG. 10B a second embodiment of a solder dispensing head 350 for use in the stenciling machine 2 is shown. The solder dispensing head 350 of FIG. 10B is described in detail in U.S. patent application Ser. No. 4,622,239 by Schoenthaler et al., incorporated herein by reference. The solder dispensing head 350 operates generally as follows. The solder dispensing head 350 comprises a rectangular housing 360 attached to a pair of arms 372 which are connected to a mechanism (now shown) that serves to move the housing across the stencil along an axis representing by double arrow 374. The housing is comprised of a pair of parallel side spaced walls 362. Extending from the lower edge of each of the walls 362 is one of a pair of inwardly and outwardly directed bottom walls 363. The bottom walls 363 provide the housing 360 with a V-shaped bottom. The bottom walls 363 do not intersect because a gap or slot 365 is provided therebetween which runs the length of the side walls 362.

Each of the bottom walls 363 has a pocket 368 in the lower exposed surface thereof in communication with the slot 365. Each of the pockets 368 runs horizontally along the length of the side walls 362 and is resized to receive a separate one of a pair of bar shaped, elastometric squeegee blades 370 therein so that an edge on each blade projects vertically downward from the pocket. The blades 370 have a width slightly larger than each of the pockets 368 so that the space in between the blades is less than the width of the slot 365. A working area 364 is defined between the blades 370.

Slidably mounted within the housing 360 is a piston 370. The piston 370 is generally rectangular in shape and has a V-shaped bottom 376. A pair of spaced, parallel continuous lips 374 each extend horizontally outward from the sides and ends of the piston 370. The lips 374 reduce the area of the piston 370 that contacts the interior surface of housing 360 to minimize the friction therebetween.

Between the lips 374 there is a U-shaped channel 378. After the piston has been inserted in the housing 360, the channel is filled with a fluid (not shown) to prevent air from leaking in between the piston 370 and the housing 360. To facilitate the admission of fluid into the channel 378, openings in the form of notches or the like are provided in the upper one of the lips 374.

A viscous joining material such as a solder paste is admitted into the housing 360 below the piston 370 via a hollow manifold 380 attached to one of the side walls 362 of the housing. The manifolds has a cavity 382 sealed by way of a plate 383. At the center of the manifold 380 is an inlet 384 in communication with the cavity 382 to allow the solder paste to be admitted into the cavity at relatively high pressure. A plurality of spaced apertures are provided in the plate 383 so to extend through the one side wall 362 of the housing 360 to allow solder paste to be admitted from the cavity 382 to enter the housing 360. The advantage of directing the viscous solder paste through the cavity 382 and into the spaced, progressively larger size apertures is that the pressure drop which is experienced by the solder paste during its flow is compensated for by the increasing cross sectional area of the cavity and the progressively increasing diameter of the apertures. In this way, the solder paste evenly fills a void in the housing 360 beneath the piston 370 without voids or bubbles. To insure that the paste is admitted into housing 360 below the piston 370, stops (not shown) may be provided on either side of the end walls to prevent the piston from descending below the apertures. In one embodiment, a strip heater 390 runs horizontal to the side wall 362, opposite the one which mounds the manifold 380 to heat the solder to adjust and control the viscosity of solder paste. Accordingly, solder paste, which normally has a high viscosity that makes the dispensing thereof very difficult, can be heated to a free flowing state for ease of dispensing. Once the heated solder paste is forced through the stencil opening and onto the surface of the circuit board, the paste cools causing the viscosity and tackiness of the solder to return to the original levels.

During operation, the housing is moved across the stencil while at the same time a pressurized fluid is directed against the piston 370. The fluid pressure causes the piston 370 to descend into housing 360, thereby forcing the solder paste out through the slot 365 and into the working area 364 above the stencil. The blades 370 force paste within the region into the openings of the stencil to print the solder paste onto the circuit boards. Once a sufficient quantity of paste has been printed on the circuit board the pressure against the piston is released to terminate the dispensing of the paste.

Accordingly, a second embodiment of the solder dispensing head is provided that uses fluid pressure upon a piston to express solder through a screen and onto a circuit board. Like the embodiment of FIG. 10A, multiple passes of the solder dispensing head 310 are often undertaken to stencil the entire circuit board. In addition, like the solder gathering head embodiment described with regards to FIGS. 7 and 8A–8C, the solder paste is retained within the solder dispensing head, and thus the stenciling machine is free to process circuit boards in any desired order. Since the solder dispensing head 350 retains the solder within the head, there is no need for the processing steps described with regard to FIGS. 6a–6d to be executed since all of the paces contained within the head.

Referring now to FIG. 10C, a third embodiment of a solder dispensing head as shown. The solder dispensing head 428 of FIG. 10C is described in U.S. patent application Ser. No. 08/598,288 filed Feb. 8, 1996 by Freeman et al. and incorporated herein by reference. In general, the solder dispensing head 428 operates as follows. The dispensing head 428 of FIG. 10C includes a housing 434 having an elongated chamber 436 having a rotatable member 440 therein. Housing 434 has an inlet 442 connected to receive solder paste into the chamber 436 and an elongated opening 444 at the bottom of the chamber for delivering solder paste from the chamber.

Housing 434 also has a lower surface 446 which tapers to a gasket or blade 447 that makes sealable contact with the upper surface of the stencil. In fact, each of the blades 447 "scrapes up" the solder remaining on the stencil so that there is no excess solder (which can harden over time) left of the stencil. Housing 434 is moved in the direction of arrow 452 and the rotatable member 440 rotates about the axis of rotation 455. In one embodiment, rotatable member 440 is rotated by the squeegee motor 33 (FIG. 2) in a clockwise direction to create a higher pressure over the elongated opening 444. The solder dispensing head 428 also includes a temperature controller 449 for adjusting the temperature and thus the viscosity of the solder paste. Rotation of the rotatable member 440 within the chamber 436 creates a load on member 440 that forces the solder to be extruded from the opening 444.

During operation, the speed of the rotation of the cylindrical member 440 as well as the temperature of the solder paste can be adjusted in order to control the pressure and viscosity of the solder paste at opening 444 and thus control the application of solder paste through the stencil. During operation, solder is fed within the chamber 436, and the rotation of the member 440 urges the solder out of slot 444 onto the stencil. The solder dispensing head may then be propelled in either direction along the stencil in multiple passes for stenciling the circuit board.

Accordingly, three embodiments of a solder dispensing head have been provided that may also be used in the stenciling machine illustrated in FIG. 2. The solder dispensing heads have an advantage over the general purpose solder head that was previously described which uses a pair of blades and a bead of paste that is deposited on the stencil board and then stroked across in a predetermined sequence described above. In addition, the solder dispensing heads, although they may require multiple passes over each of the circuit boards, do not require the retrieving steps of gathering the solder as is used in the solder gathering head apparatus. However, depending on the availability of components and the desired processing time, any of the solder gathering or dispensing mechanisms that have been described herein may alternatively be used in the stencil mechanism stencil machine and accordingly the invention should not be limited to any particular embodiment.

Accordingly, a flexible dual track stenciling system has been described that utilizes either a solder gathering squeegee head or a variety of solder dispensing heads to ensure that there is no limitation as to which board or which track need be processed next. This is because, the solder for stenciling boards is retained within the solder head, rather than being disposed on the screen. In addition, the solder gathering head allows for a processing sequence that has enhanced performance, since the Z-tower need only be elevated once for the processing of two boards. In an alternative embodiment, the solder heads allow for stenciling to occur in either y axis direction, thus increasing the variety of processing methods available in the dual track stenciling system.

According to another embodiment, the dual track system for a stencil machine described above is modified to provide movement of the rails along the y-axis. By allowing the rails to move along the y-axis, different size boards may be accommodated.

The selection of which rails should be moveable is partly dictated by the flexibility of the pick and place machine of the manufacturing process. Many commercially available pick and place machines are provided with a first and third rail fixed (non-movable), or a first and fourth rail fixed. In one embodiment of the present invention, rail 1 may be fixed, while rails 2, 3 and 4 may be moved along the y axis to accommodate variable width boards. Rails 1, 2, 3, and 4 respectively correspond to rails 22, 24, 26 and 28 of FIGS. 6a–6d and FIGS. 9a–9e.

Figure 11:
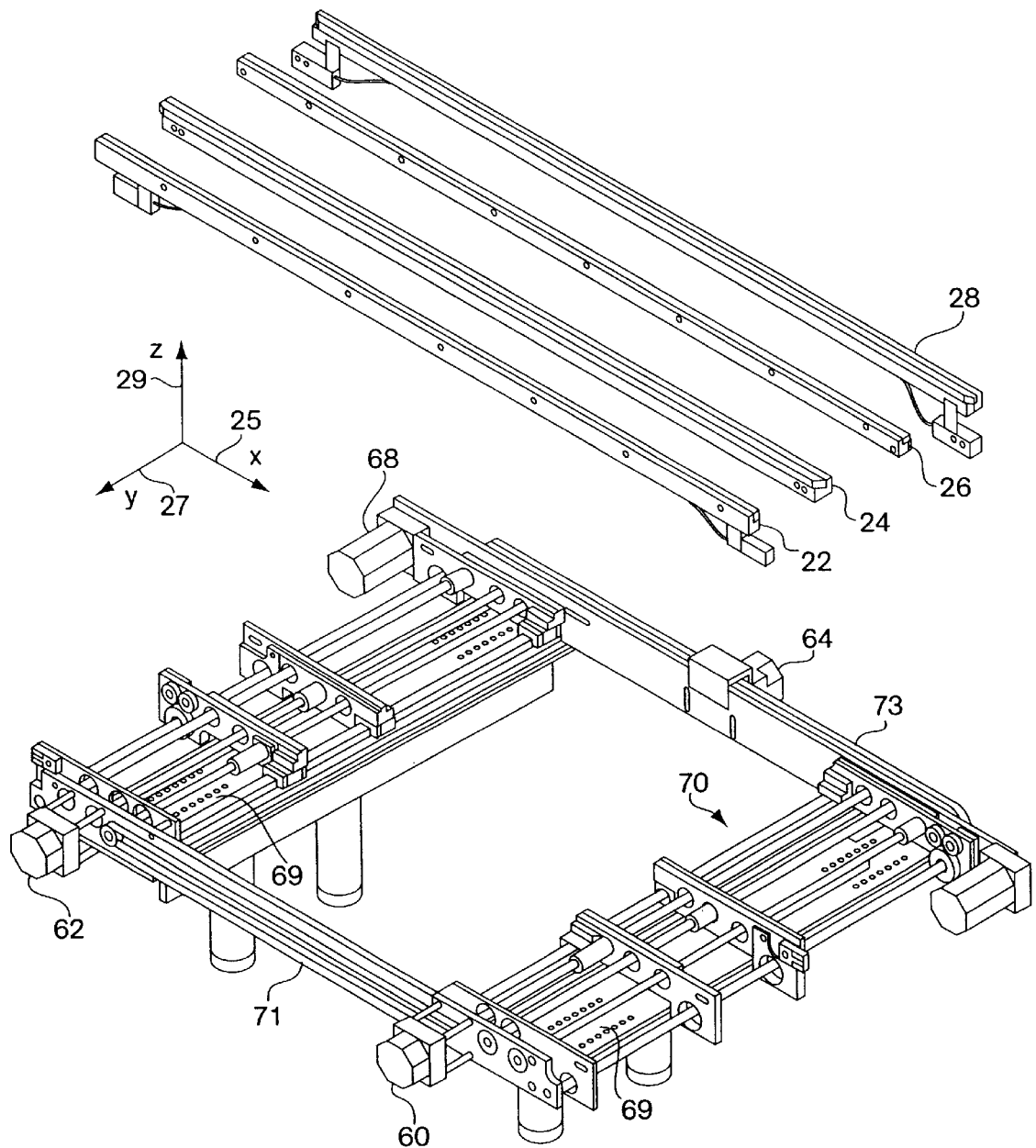
FIG. 11 is a diagram illustrating the motor control and rails of the stenciling system of FIG. 2.

Referring now to FIG. 11, the control of the moveable rails is shown in more detail to include a rail 2 motor 60, and a rail 3 motor 62 each coupled to a front support plate 71, and a rail 4 motor 64 coupled to a rear support plate 73. Each of these motors has independent control over the positioning of the rails relative to rail 1. Each motor is controlled via control logic managed by the computer system of the stencil machine. Each motor moves its associated rail in the y-axis 27 along the spacing rails 70. FIG. 11 also shows more clearly the locations of x-axis motors 66 and 68 that control the advancement of the conveyor belts of the dual track system, as described previously with respect to FIG. 4.

As mentioned above, in one embodiment of the invention, the first rail is fixed. Apertures 69 provide alternative fixed placement locations for the first rail.

Figure 12:
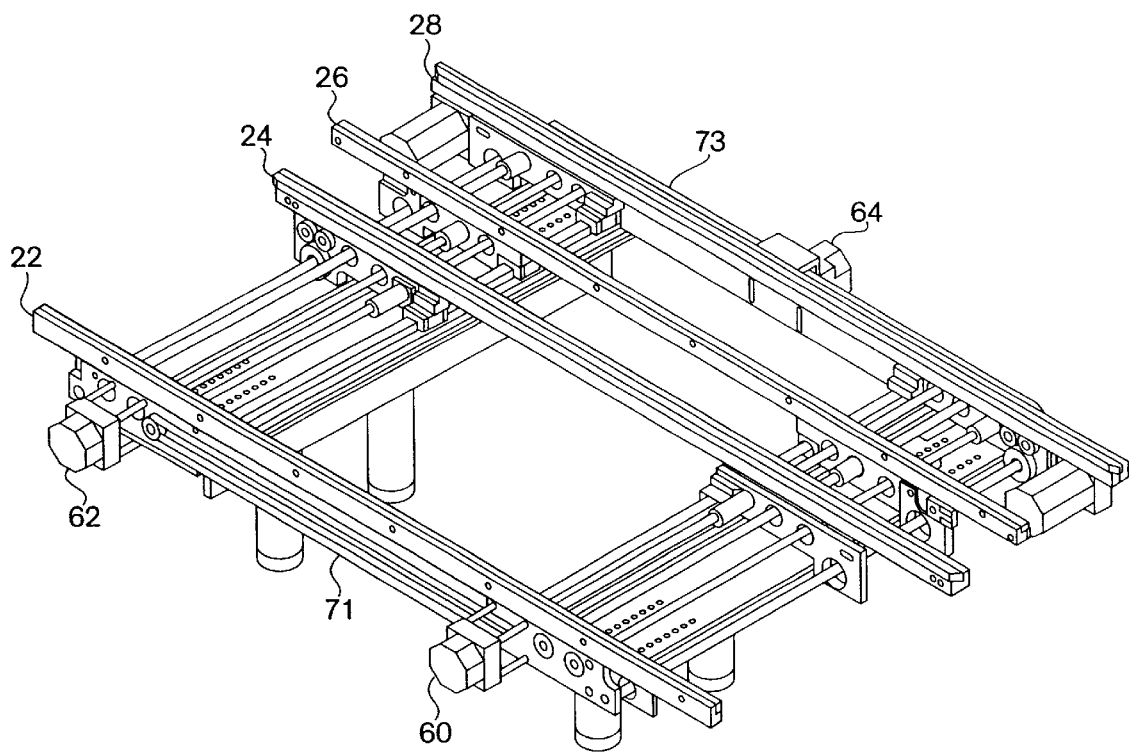
FIG. 12 is a diagram illustrating the arrangement of rails in the operation of the stenciling system in single track mode.

In the embodiment shown in FIG. 11, the rails may be adjusted to handle boards ranging in size from 2"×2" to 20"×10" in dual track mode. The system further provides the additional flexibility of being able to operate on larger boards in single track mode. Single track mode may be achieved, as shown in FIG. 12, by moving the rails of the track that are not in use towards the rear support plate 73. Rails 3 and 4 are moved to be adjacent to one another, and in this position will not receive incoming boards. Rail 2 is moved adjacent to Rail 3, and will be used, with rail 1, as usual to support boards to be processed on track A. In one embodiment, in single track mode, the system is capable of processing boards in the range from 2"×2" to 20"×20", depending upon the spacing between rail 2 and rail 1.

Thus, size configurability of the stenciling machine is flexible enough to adapt to spacing requirements if board standards or sizes change. In a preferred embodiment, they may range from two 8.5 inch maximum width boards with a 2 inch space in between the boards to two 10 inch maximum width boards with a 4 inch space between the boards in dual track mode. Similarly, maximum boards widths may range from 17 to 20 inches in single track mode. Variations in the spacing standards is preferably provided in 0.5 inch increments, creating a possibility of 20 rails spacing varieties, but these standards may be altered to accommodate the needs of the user.

The position of the patterns on the stencils used in the moveable rail system are directly dependent upon the specific spacing of the rails for that process. Thus dedicated stencils may be required to support each possible rail spacing option.

In addition to providing a number of stencils to support various size boards and dual and single track modes of operations, a number of porting plates may be provided to ensure that the apertures in the porting plates are appropriately located to provide optimum retention of different size circuit boards.

Figure 13:
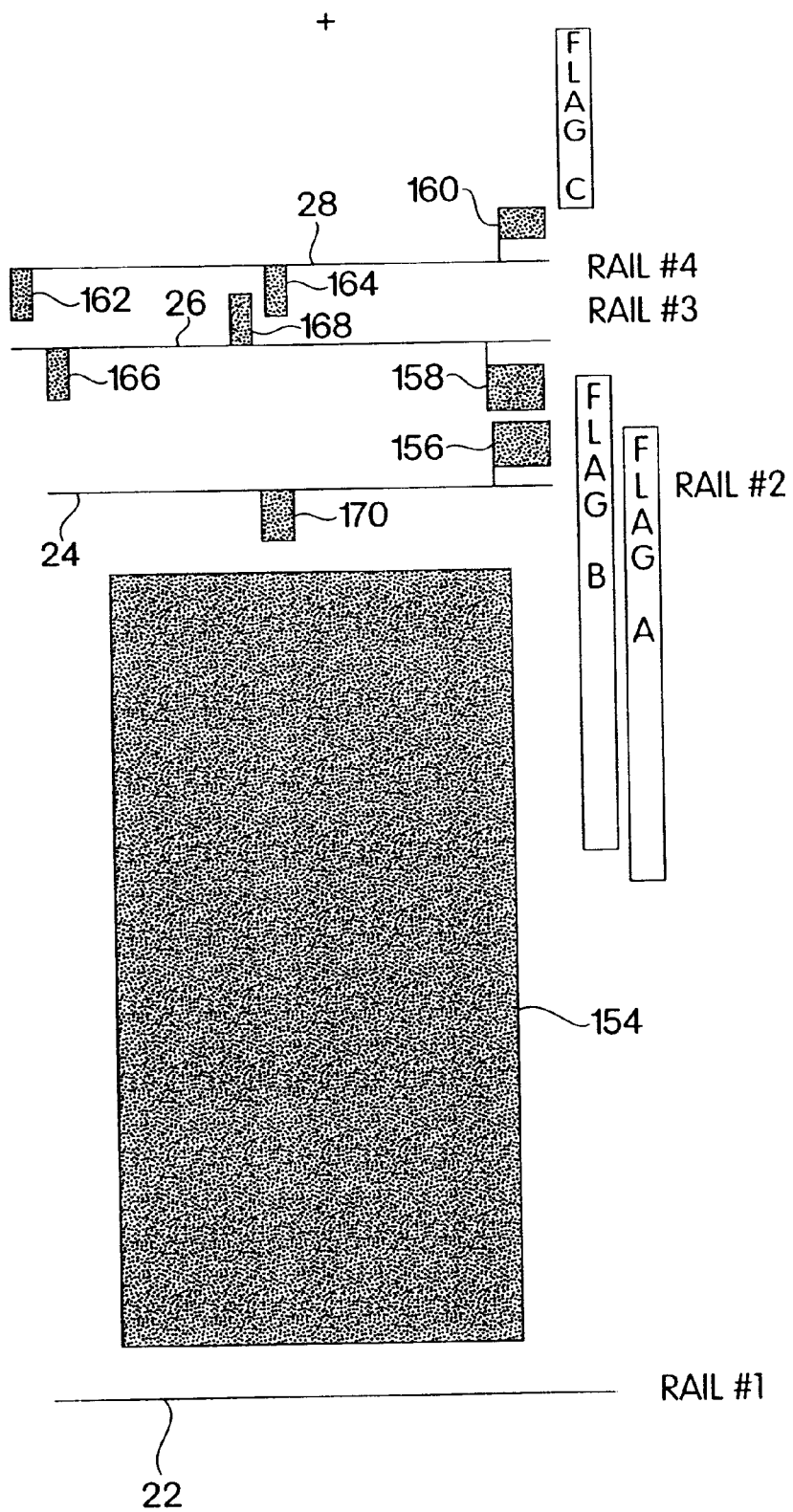
FIG. 13 is a diagram illustrating the position of rails in a single track mode.
Figure 14:
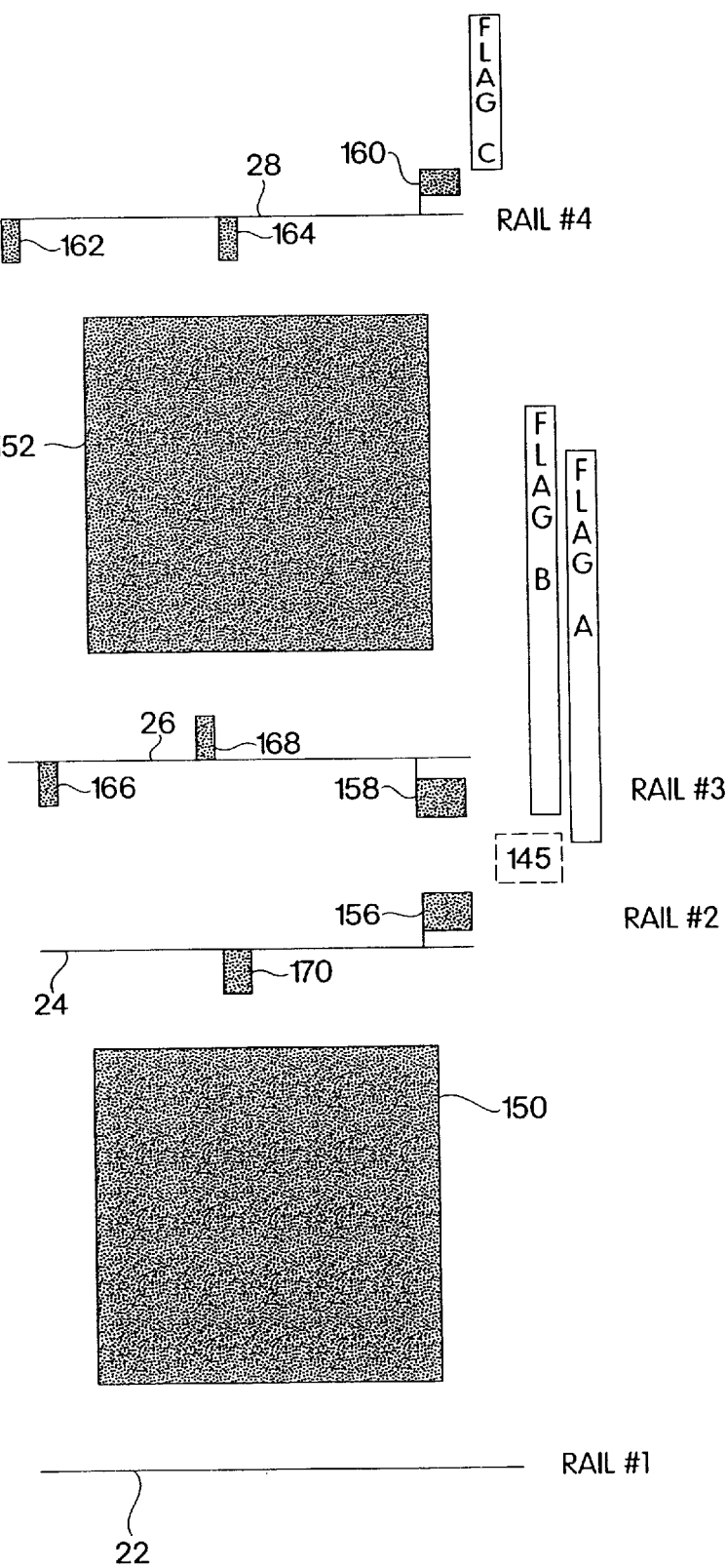
FIG. 14 is a diagram illustrating the position of rails in a dual track mode.
Figure 15:
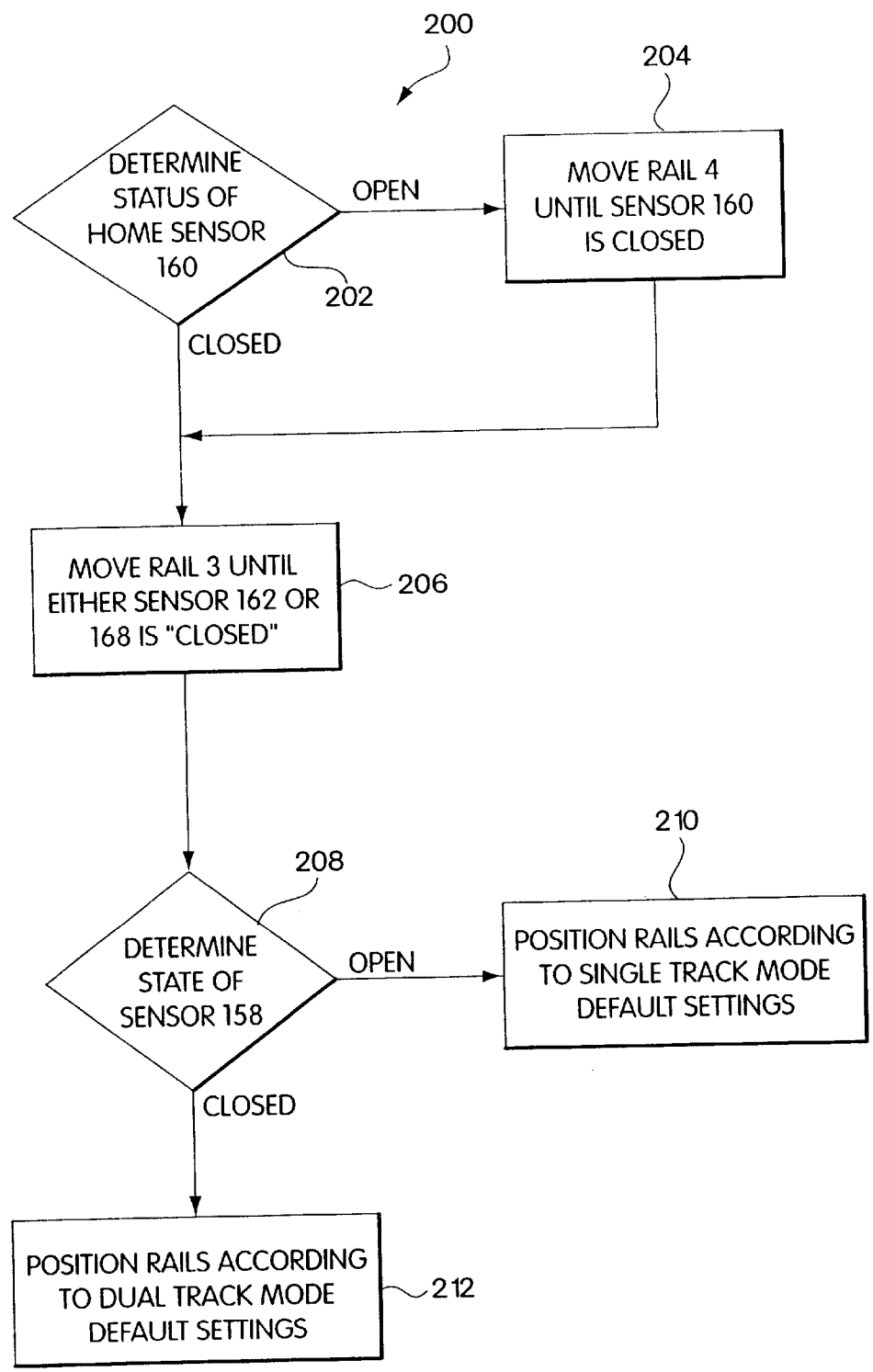
FIG. 15 is a flow diagram illustrating a reboot/reset process.

In one version of this embodiment, the computer system 21 is configured upon reset or reboot to determine whether the rails are positioned for single track mode or dual track mode. Although this procedure could be accomplished manually, it is desirable to perform this using the computer system as described below to prevent any damage to the stencil machine from a faulty input by a user. The procedure by which the computer control system 21 accomplishes the reset/reboot will described with reference to FIGS. 13–15. FIG. 13 shows the dual rail system of FIG. 11 with the rails positioned in a single track mode with a single worknest 154 positioned between the first rail 22 and the second rail 24. FIG. 14 shows the dual rail system of FIG. 11 with two worknests 150 and 152. Worknest 150 is positioned between the first rail 22 and the second rail 24, and worknest 152 is positioned between the third rail 26 and the fourth rail 28. FIG. 15 shows a flow diagram of the reset/reboot process 200. The rails in FIGS. 14 and 15 can move in a direction towards the + sign (defined as the positive direction) and can move in a direction towards the – sign (defined as the negative direction).

As shown in FIGS. 13 and 14, each of the second, third and fourth rails has a home sensor 156, 158 and 160. The home sensors may be implemented using optical, magnetic or other available sensors. These home sensors detect whether the sensors are in alignment with one of flags A, B and C. When a sensor detects one of the flags, the sensor is defined to be in a "closed" position. When a sensor does not detect a flag, it is defined to be in an "open" position. By moving the rails and detecting the transitions from open to closed, there are five positions at which the absolute locations of the rails can be determined (note that rail 4 cannot move past flag C in the direction indicated by the + sign).

The rails also include proximity sensors. Rail 4 has proximity sensors 162 and 164, rail 3 has proximity sensors 166 and 168, and rail 2 has proximity sensor 170. The proximity sensors are implemented using optical, magnetic or other available sensors, and are used to detect when the rail is in close proximity to another object (i.e one of the worknests or another rail). Each of the home sensors and the proximity sensors is coupled to the computer system to relay their status (open or closed) to the computer system.

The process 200 for determining the mode of operation upon reset or reboot will now be described with reference to FIG. 15. In step 202, the computer system checks the status of the home sensor 160 on rail 4. If the status of the sensor is "closed", then the process proceeds with step 206. If the status of the sensor is "open", then the process proceeds to step 204 where rail 4 is moved in the positive direction until the status of the home sensor 160 changes to closed (the position of rail 4 in FIG. 14). The process then continues with step 206.

In step 206, rail 3 is moved in the positive direction until either sensor 168 on rail 3 is closed by work nest 152 or until sensor 162 on rail 4 is closed by rail 3. In step 208 the status of home sensor 158 is checked by the computer system. If home sensor 158 is "open", then rail 3 is in the position shown in FIG. 13, and the system is configured for single track mode of operation. The process then proceeds in step 210 to determine the true locations of rails 2 and 3 by detecting the rear edges of flags A and B and then positioning the rails according to default single track mode settings.

If home sensor 158 is in the "closed" position at step 208, then rail 3 is in the position shown in FIG. 14, and the system is configured for dual track mode. The process then proceeds in step 212 to determine the true locations of rails 2 and 3 by detecting the front edges of flags A and B and then positioning the rails according to default dual track mode settings stored in the computer system.

The automated reset/reboot process described above offers the advantage of automatically positioning the rails to default single track mode or default dual track mode settings based on the configuration (dual mode or single mode) of the stencil machine without operator intervention.

Figure 16:
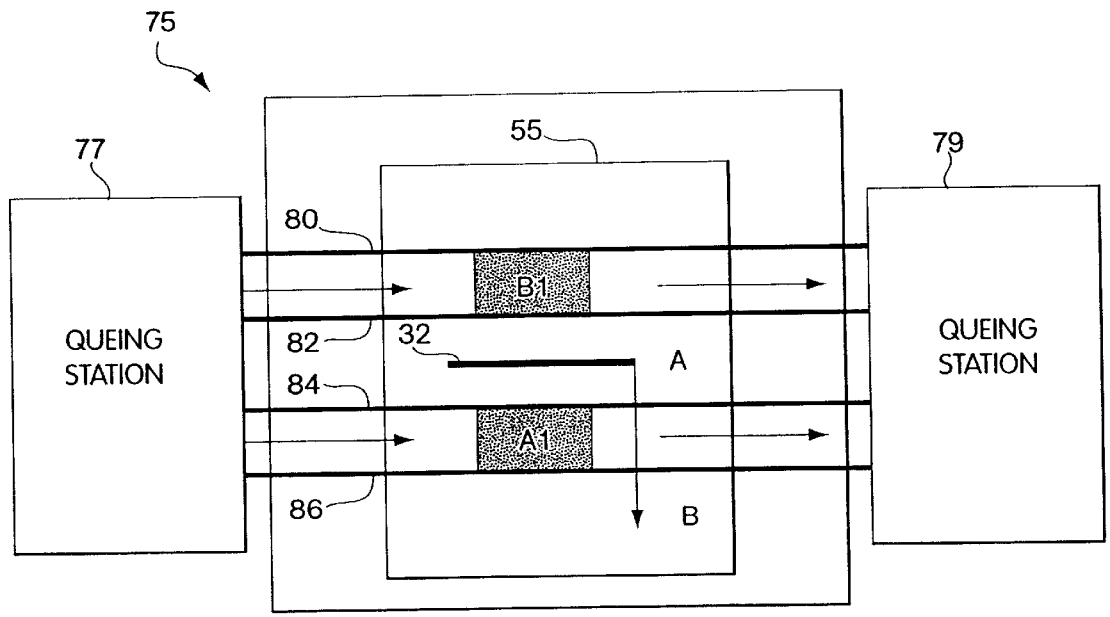
FIG. 16 is a diagram of another embodiment of the dual rail system, where the dual rail system has shortened rails.

Referring now to FIG. 16, another embodiment of the dual rail system is shown, wherein the rails are shortened. In this embodiment the rails have been shortened because, it may occur that a customer, purchasing the dual rail system, may already possess equipment with queuing stations for loading and unloading the stencil machine. Alternatively, it may occur that the pick and place machine that exists at a circuit manufacturing plant already has associated therewith a loader unit. In order to facilitate a variety of existing configurations, this embodiment of the dual rail system is provided with shortened rails 80, 82, 84 and 86. The operation of this unit is similar to that described with regard to FIGS. 6a–6d and FIGS. 9a–9e, with position 1 and position 3 representing respective queue positions in the queuing stations 77 and 79. However, it should be noted that in this embodiment, the boards are moved only to one position within the dual rail system, that position being the work nest 55. Thus this configuration would not have the constraints that may cause system down situations, described above with reference to FIGS. 6a–6d.

Figure 17:
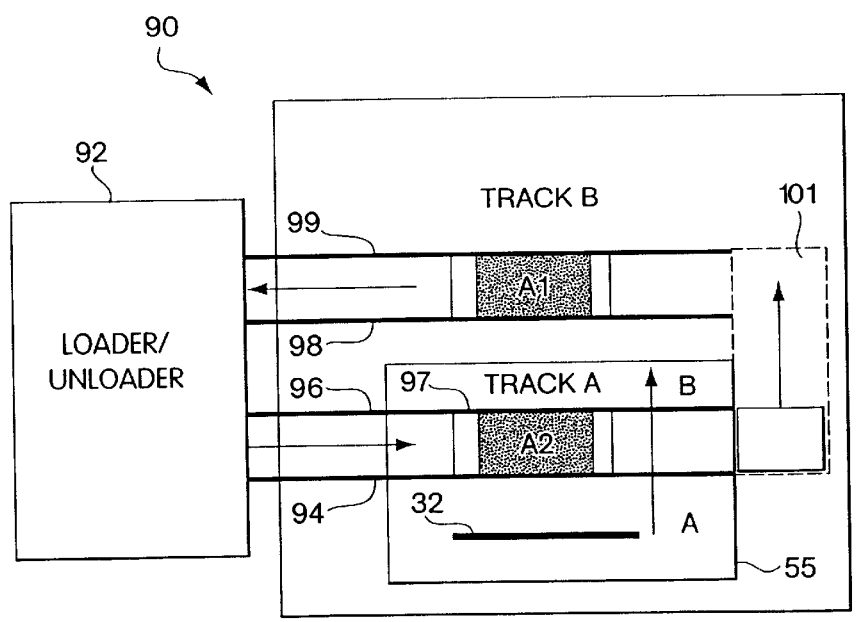
FIG. 17 is a diagram of another embodiment of a dual rail system that provides all material handling on a single side of the system.

Referring now to FIG. 17, another embodiment of the present invention is shown that illustrates the abilities of the dual track system for handling delicate materials, for example green tape. Green tape is a ceramic type substance that is non-rigid before firing. Because of its non-rigid nature, it is usually transported on a pallet through the stenciling system, which provides added support. In FIG. 17, a loader/unloader device 92 is shown coupled to a first set of rails 94 and 96 and a second set of rails 98 and 99. The pallets enter the stencil machine 90 from the loader/unloader on the first set of rails, and return to the loader from the stencil machine on the second set of rails. Pallets are passed from the first set of rails to the second set of rails using a shuttle device 101. The shuttle device receives pallets after printing has occurred from the first set of rails and transports the pallets to the second set of rails. In FIG. 17, the shuttle device is shown in the position to receive a pallet from track A. After receiving a pallet, the shuttle device moves the pallet in the direction of the arrow to provide the pallet to track B.

To accommodate the above-described recirculating rail system, the work nest 55 is altered so that it works only on boards on track A and not on track B. Thus, during operation, when a board such as board A2 is raised in the work nest on the Z-tower, board A1 may still travel unaffected on track B, and return to the loader/unloader 92.

Figure 18:
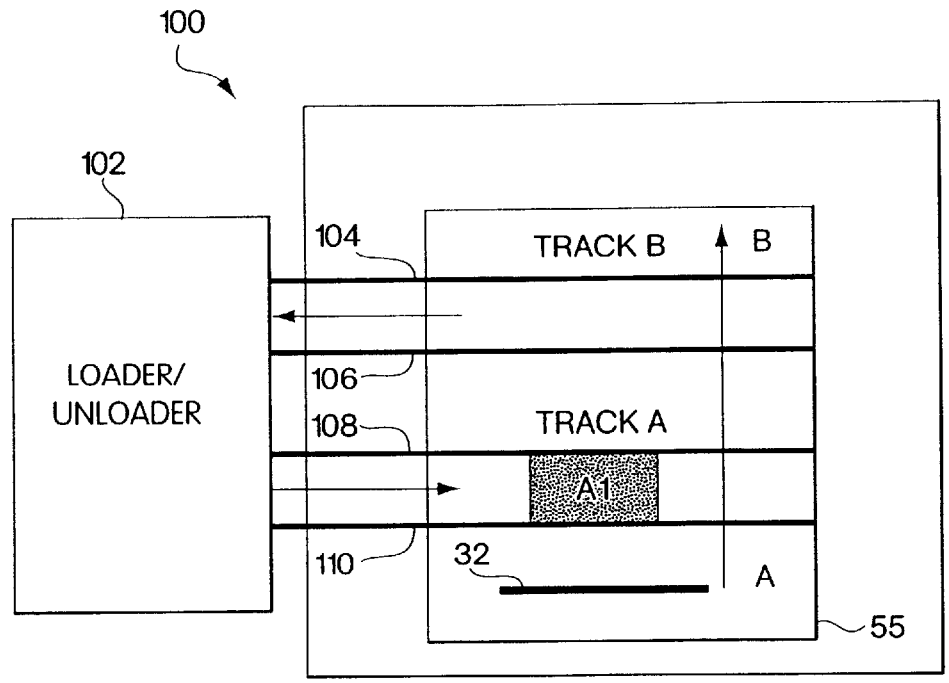
FIG. 18 is a diagram of another embodiment of a dual rail system that provides all material handling on a single side of the system.

Referring now to FIG. 18, another embodiment of the invention is shown. In the fifth embodiment, a stencil machine 100 has a first set of rails 108 and 110 and a second set of rails 104 and 106. Similar to the fourth embodiment described above, in the fifth embodiment, boards (or some other substrate) are loaded and unloaded into the stencil machine from only one side. The fifth embodiment differs from the fourth embodiment in that boards are loaded and unloaded by the loader/unloader 102 from each of tracks A and B, and printing occurs on both of tracks A and B. In the fifth embodiment, printing occurs on only one of tracks A and B at a time in an alternating manner.

Figure 19:
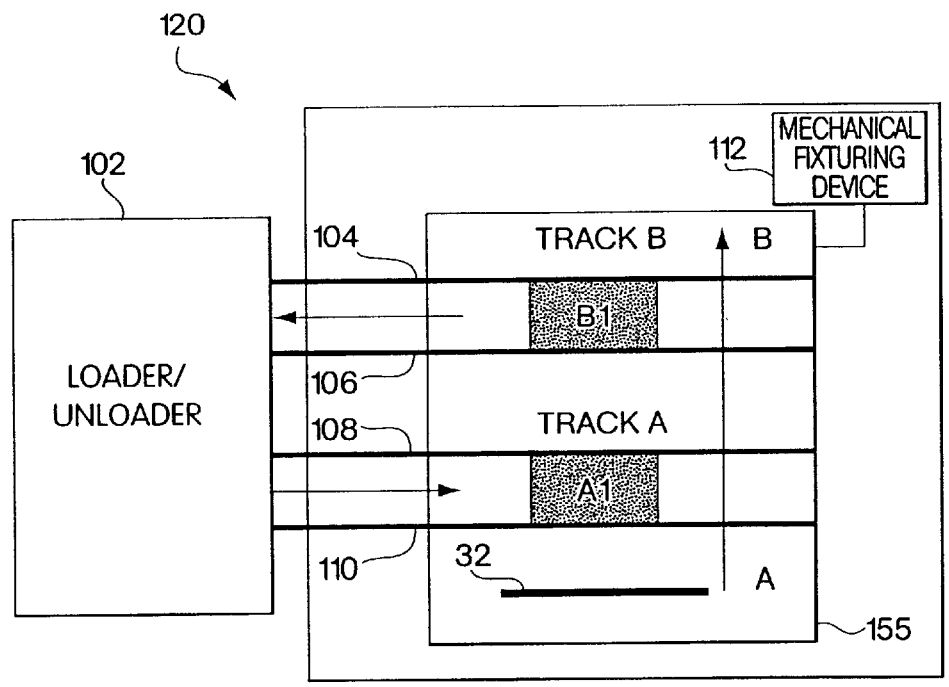
FIG. 19 is a diagram of a dual rail system having a mechanical fixturing device that allows printing on two boards simultaneously.

Referring now to FIG. 19, another embodiment of the invention is shown that allows for increased stenciling throughput by permitting the stenciling of two boards with one stroke of the squeegee head 32 and one z-axis motion. The sixth embodiment is similar to the fifth embodiment, except that in the sixth embodiment, a stencil machine 120 includes a mechanical fixturing device 112 used in place of an optical alignment system to properly align the boards in the x, y, and θ axes. The mechanical fixturing device is pre-aligned with the stencil before the boards are received by the stencil machine, and supports the boards in the proper aligned position. In one embodiment, the mechanical fixturing device uses side snuggers for holding the board in proper alignment in the stencil machine. This embodiment is preferably used with boards or other substrates for which alignment of the board can be achieved using the edges of the board.

The mechanical fixturing device eliminates the need for the optical alignment step described with reference to the stencil machine of FIG. 1. In the embodiment of FIG. 19, a loader/unloader 102, or some other type of loader is used to forward the boards to the work nest. The squeegee is positioned at point A and applies the solder paste over the stencil in a manner as described above, thereby printing both boards. The boards are then retrieved by the loader/unloader.

The mechanical fixturing device 112 of FIG. 19 may also be used in the embodiments of the present invention that are designed to receive material on one side of the stencil machine and deliver material on another side of the stencil machine to, for example, a pick and place machine, thereby increasing throughput of the stencil machine. In this situation, the pick and place machine should be configured to receive and operate on two boards simultaneously to maximize throughput.

Multiple embodiments of a dual track system have been described to show the flexibility and potential of such a system to many different circuit board manufacturing requirements. It should be noted that, although the above description discusses a dual track system, the present invention is not limited to such a construction. It is envisioned that a multi-track system, having more than two tracks, could also be provided by adjusting the ordering sequence of board processing, and potentially adding more hardware if feasible to maintain performance. Note that the multi-track system could comprise a number of fixed tracks or similarly use the moveable rail mode of operation taught herein.

Accordingly, a method and apparatus has been shown for providing increased performance in the stencil phase of the circuit board manufacturing process. By providing a dual track system, circuit board throughput is increased, and dwell time between machines is reduced. In addition two processing sequences have been provided that allow existing stenciling components to be used, thus minimizing the extent of additional hardware and minimizing the overall cost of the system. Each of the processing sequences may use different solder containing heads, and therefore a flexible system that may process circuit boards in a dual track stenciling system in a variety of sequences has been provided. In addition, according to another embodiment of the invention, the rails of the dual tracks are moveable to allow for the processing of different width boards by one stencil machine. In addition, the moveable rails allow for increased compatibility between the stenciling machine and a variety of pick and place machines provided by other vendors and varying Printed Circuit Board (PCB) sizes. Further, the use of moveable rails allows the stenciling machine to be converted for operation in single track mode when desired. The dual track rails may alternatively be shortened, to accommodate existing equipment in the circuit board manufacturing process. In addition, it has been shown how the throughput for handling delicate materials may be accomplished. Finally, an apparatus that provides high throughput by allowing for printing on both rails has also been described.

Although embodiments of the invention have been described primarily with respect to stencil machines that print solder paste on circuit boards, the embodiments present invention is not limited to solder paste printers, but may be used in other printers for printing materials such as glues and inks on substrates other than circuit boards.

Having described a preferred embodiment of the invention, it will now become apparent to one of skill in the art that other embodiments incorporating its concepts may be used. It is felt, therefore, that this invention should not be limited to the disclosed embodiment, but rather should be limited only by the spirit and scope of the appended claims.

What is claimed is:

1. A stencil system for use in circuit board manufacturing, comprising:
    a frame;
    a stencil coupled to the frame, the stencil having a first pattern for printing material on a first circuit board at a first work position and a second pattern for printing material on a second circuit board at a second work position; and
    means for simultaneously moving the first circuit board to the first work position and the second circuit board to the second work position.

2. The stencil system of claim 1, wherein the means for simultaneously moving includes a first set of rails and a second set of rails, and wherein the stencil system further includes means for adjusting a spacing of rails in the first set of rails and a spacing of rails in the second set of rails.

3. The stencil system of claim 2, further comprising a material dispensing unit disposed over the stencil for dispensing material on a surface of the stencil.

4. The stencil system of claim 3, wherein the dispensing material is one of solder and glue.

5. The stencil system of claim 4, further comprising a vacuum system disposed below the stencil that retains the first circuit board at the first work position in the stencil system and retains the second circuit board at the second work position in the stencil system.

6. The stencil system of claim 5, wherein the stencil has a first pattern for printing material on the first circuit board and a second pattern for printing material on the second circuit board.

7. A stencil system for use in circuit board manufacturing, comprising:
   a frame;
   a plurality of sets of rails, coupled to the frame, each of said plurality of sets of rails for supporting and moving a plurality of circuit boards through said stenciling system along a first axis, wherein at least three of the rails of the plurality of sets of rails are moveable in a direction orthogonal to the first axis; and
   a stencil, coupled to the frame, and disposed above the plurality of sets of rails.

8. The stencil system of claim 7, wherein the system is configured and arranged such that the at least three rails are separately controlled to be moveable independently.

9. The stencil system of claim 8, further comprising a material dispensing unit disposed over the stencil for dispensing material on a surface of the stencil.

10. The stencil system of claim 9, wherein the dispensing material is one of solder and glue.

11. The stencil system of claim 10, further comprising a vacuum system disposed below the plurality of sets of rails that retains a first circuit board at a first work position in the stencil system and retains a second circuit board at a second work position in the stencil system.

12. The stencil system of claim 11, wherein the stencil has a first pattern for printing material on the first circuit board and a second pattern for printing material on the second circuit board.

13. The stencil system of claim 7, further comprising a vacuum system disposed below the plurality of sets of rails that retains a first circuit board at a first work position in the stencil system and retains a second circuit board at a second work position in the stencil system.

14. The stencil system of claim 7, wherein the stencil has a first pattern for printing material on the first circuit board and a second pattern for printing material on the second circuit board.

* * * * *